US009502219B2

(12) United States Patent
Kihara et al.

(10) Patent No.: US 9,502,219 B2
(45) Date of Patent: Nov. 22, 2016

(54) PLASMA PROCESSING METHOD

(71) Applicant: TOKYO ELECTRON LIMITED, Tokyo (JP)

(72) Inventors: Yoshihide Kihara, Miyagi (JP); Masaya Kawamata, Miyagi (JP); Toshio Haga, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/433,522

(22) PCT Filed: Oct. 30, 2013

(86) PCT No.: PCT/JP2013/006428
§ 371 (c)(1),
(2) Date: Apr. 3, 2015

(87) PCT Pub. No.: WO2014/068974
PCT Pub. Date: May 8, 2014

(65) Prior Publication Data
US 2015/0262794 A1 Sep. 17, 2015

Related U.S. Application Data

(60) Provisional application No. 61/725,574, filed on Nov. 13, 2012.

(30) Foreign Application Priority Data

Nov. 5, 2012 (JP) ................................. 2012-243356

(51) Int. Cl.
*H01L 21/302* (2006.01)
*H01J 37/32* (2006.01)
*H01L 21/3065* (2006.01)
(Continued)

(52) U.S. Cl.
CPC ...... *H01J 37/32568* (2013.01); *H01J 37/3244* (2013.01); *H01J 37/32091* (2013.01);
(Continued)

(58) Field of Classification Search
None
See application file for complete search history.

(56) References Cited

U.S. PATENT DOCUMENTS

2006/0021580 A1* 2/2006 Hirano ............. H01J 37/32174
118/722
2008/0237187 A1* 10/2008 Dhindsa ............ H01J 37/32183
216/71

(Continued)

FOREIGN PATENT DOCUMENTS

JP 2003-282542 A 10/2003
JP 2004-193566 A 7/2004

OTHER PUBLICATIONS

International Search Report mailed Feb. 4, 2014 in PCT/JP2013/006428.

*Primary Examiner* — Shamim Ahmed
(74) *Attorney, Agent, or Firm* — Rothwell, Figg, Ernst & Manbeck, P.C.

(57) ABSTRACT

The present disclosure provides a method of performing a plasma processing on a substrate by using a plasma processing apparatus including a processing container; an outer upper electrode provided to face a lower electrode; an inner upper electrode disposed inside the outer upper electrode; a first high-frequency power supply; a first power feeding unit; a second power feeding unit; and a variable condenser. The first and second power feeding units, a fixed condenser formed between the outer upper electrode and the inner upper electrode, and a closed circuit including the variable condenser become a resonance state when the variable condenser has a capacitance value in a predetermined resonance region. The method includes selectively using a capacitance value in a first region lower than the resonance region of the variable condenser and a capacitance value in a second region higher than the resonance region to perform the plasma processing.

5 Claims, 17 Drawing Sheets

(51) Int. Cl.
*H05H 1/46* (2006.01)
*H01L 21/311* (2006.01)

(52) U.S. Cl.
CPC .... H01J37/32174 (2013.01); H01J 37/32449 (2013.01); H01J 37/32541 (2013.01); *H01L 21/3065* (2013.01); *H01L 21/31116* (2013.01); *H01L 21/31122* (2013.01); *H01L 21/31138* (2013.01); *H05H 2001/4682* (2013.01)

(56) References Cited

U.S. PATENT DOCUMENTS

2010/0018648 A1* 1/2010 Collins ............. H01J 37/32082
156/345.24
2010/0252199 A1* 10/2010 Marakhtanov .... H01J 37/32091
156/345.48

* cited by examiner

POSITION ON WAFER

POSITION ON WAFER

PLASMA PROCESSING METHOD

CROSS REFERENCE TO RELATED APPLICATION

This application is a 35 U.S.C. 371 National Phase Entry Application from PCT/JP2013/006428, filed Oct. 30, 2013, which claims priority to and the benefit of U.S. Provisional Application No. 61/725,574, filed Nov. 13, 2012 and Japanese Patent Application No. 2012-243356, filed Nov. 5, 2012, the disclosures of which are incorporated herein in their entirety by reference.

TECHNICAL FIELD

The present disclosure relates to a capacitively coupled plasma processing apparatus that variably controls a ratio of high-frequency powers distributed and supplied to inner and outer upper electrodes disposed to face a lower electrode on which a substrate is placed.

BACKGROUND

For a micromachining or processing such as, for example, etching, deposition, oxidation, or sputtering in a manufacturing process of a semiconductor device or a flat panel display (FPD), plasma is used to subject processing gas to an excellent reaction at a relatively low temperature. Discharge is typically used for generating plasma. Plasma processing apparatuses are generally classified into a plasma processing apparatus using high-frequency discharge and a plasma processing apparatus using microwave discharge. High-frequency discharge systems are also classified into a capacitively coupled system in which a parallel flat panel electrode is provided within a processing container and an inductively coupled system in which a spiral or swirling electrode is attached around the processing container. Among several plasma generation systems, the capacitively coupled system has become a mainstream of a device for mass production and a device for device development.

In the capacitively coupled plasma processing apparatus, an upper electrode and a lower electrode are arranged in parallel within a pressure-reducible processing container or reaction container, a processing target substrate, for example, a semiconductor wafer, is placed on the lower electrode, and high-frequency waves having a predetermined frequency are applied to the upper electrode or the lower electrode through a matching unit. Electrons are accelerated by a high-frequency electric field generated by the high-frequency waves, plasma is generated by dissociation and ionizing collision of the electrons with molecules and atoms of the processing gas, and a desired plasma processing (for example, an etching process) is performed on a wafer surface by radicals or ions in the plasma.

In a plasma process, (in-plane) uniformity of the process is a basic requirement for improving yield, the importance of the (in-plane) uniformity gradually increases with the progress of miniaturization of the semiconductor device or an increase in diameter of the semiconductor wafer, and a required level thereof increases. In this regard, in a conventional capacitively coupled plasma processing apparatus, the uniformity of the process significantly depends on uniformity of the density of plasma on the semiconductor wafer. Thus, researches have been conducted into a structure of an electrode used for generating plasma, in particular, an electrode (high-frequency electrode) to which the high-frequency waves are applied.

As one typical example, a capacitively coupled plasma processing apparatus is known, in which an upper electrode facing a lower electrode on which a substrate is placed is divided into an inner electrode and an outer electrode in a radial direction to variably control a ratio of high-frequency powers for generating plasma which are distributed to both electrodes (Patent Document 1).

In the capacitively coupled plasma processing apparatus, the outer upper electrode is electrically connected to an output terminal of a high-frequency power supply that outputs the high-frequency waves for generating plasma through a cylindrical conductive member and the inner upper electrode is electrically connected to the output terminal through a rod-shaped central conductive member. A variable condenser is inserted in the middle of the central conductive member, so that capacitance of the variable condenser is variably controlled by, for example, a step motor.

In this case, as the capacitance of the variable condenser is increased, a ratio (outer/inner power distribution ratio) $(P_o/P_i)$ of a power $(P_o)$ distributed and supplied to the outer upper electrode (that is, powers introduced into plasma through the outer upper electrode) and a power $(P_i)$ distributed and supplied to the inner upper electrode (that is, powers introduced into plasma though the inner upper electrode) is decreased. Conversely, as the capacitance of the variable condenser is decreased, the ratio (outer/inner power distribution ratio) $(P_o/P_i)$ is increased. As a result, the capacitance of the variable condenser may be variably controlled such that a plasma density distribution or a profile of a process characteristic in the radial direction is controlled in the chamber.

PRIOR ART DOCUMENT

Patent Document

Patent Document 1: Japanese Patent Laid-Open Publication No. 2004-193566

SUMMARY OF THE INVENTION

Problems to be Solved

In the capacitively coupled plasma processing apparatus configured to distribute the high-frequency power to two inner and outer upper electrodes divided in the radial direction, as described above, an uncontrollable region, that is, a resonance region is inevitably present within a capacitance variation range of the variable condenser. That is, a closed circuit is formed between respective high-frequency power feeding units that distribute the high-frequency waves from the high-frequency power supply to both upper electrodes through an electrostatic capacitor (fixed condenser) between the inner upper electrode and the outer upper electrode. The closed circuit may include not only the electrostatic capacitor (fixed condenser) and the variable condenser between the electrodes, but also an inductance associated with a conductor of each high-frequency power feeding unit. Thus, the closed circuit becomes a resonance state when a capacitance of the variable condenser has a predetermined value. Since an outer/inner power distribution ratio is significantly changed at a rapid change rate (slope) around the resonance point even though the capacitance of the variable condenser is slightly changed, fine adjustment becomes difficult, and large current flows in the closed circuit, which may result in damage of the variable condenser.

Thus, in the related art, the capacitance of the variable condenser is adapted to be variably controlled by only one region (generally, a region lower than a resonance region) by avoiding the resonance point and a region therearound (resonance region). However, since a variable range or a dynamic range of the outer/inner power distribution ratio is small in practice, an effect is slightly insufficient as an adjustment knob for controlling a plasma density distribution or a profile of a process characteristic in the radial direction.

The present disclosure is contrived to solve the problems in the related art and an object of the present disclosure is to provide a plasma processing method that remarkably improves a function as an adjustment knob for controlling a plasma density distribution characteristic of a variable condenser provided to control an outer/inner power distribution ratio or an in-plane profile of a process characteristic, in a capacitively coupled plasma processing apparatus that distributes and supplies high-frequency power to an inner upper electrode and an outer upper electrode disposed to face a lower electrode on which a substrate is placed.

Means to Solve the Problems

According to a first aspect, the present disclosure provides a method of performing a plasma processing on a substrate by using a plasma processing apparatus including: a processing container configured to be evacuated; an outer upper electrode provided annularly to face a lower electrode on which a substrate is placed in the processing container; an inner upper electrode disposed to be insulated inside the outer upper electrode in a radial direction; a processing gas supply unit configured to supply a processing gas to a processing space between the outer upper electrode and the inner upper electrode, and the lower electrode; a first high-frequency power supply configured to output a first high-frequency wave having a frequency suitable for generating plasma of the processing gas; a first power feeding unit provided with a cylindrical conductive member consecutively connected to the outer upper electrode in a circumferential direction, and configured to apply the first high-frequency wave outputted from the first high-frequency power supply to the outer upper electrode through the cylindrical conductive member; a second power feeding unit provided with a rod-shaped central conductive member connected to the center of the inner upper electrode, and configured to branch the first high-frequency wave outputted from the first high-frequency power supply from the first power feeding unit to supply the branched-off first high-frequency wave to the inner upper electrode through the central conductive member; a variable condenser provided in the second power feeding unit to adjust a ratio of a power supplied to the plasma through the outer upper electrode and a power supplied to the plasma through the inner upper electrode; and a variable condenser control unit configured to variably control a capacitance of the variable condenser. The first and second power feeding units, a fixed condenser formed between the outer upper electrode and the inner upper electrode, and a closed circuit including the variable capacitor substantially become a resonance state with respect to the first high-frequency wave when the variable condenser has a capacitance value in a predetermined resonance region. The method includes: selectively using a capacitance value in a first region lower than the resonance region of the variable condenser and a capacitance value in a second region higher than the resonance region to perform the plasma processing.

In the above-mentioned configuration, a plasma density distribution characteristic or an in-plane profile of a process characteristic may be controlled more freely and variably by expanding a selection range of the capacitance of the variable condenser (variable condenser positioning) to both a lower non-resonance region and a higher non-resonance region.

According to a second aspect, the present disclosure provides a method of performing a plasma processing on a substrate by using a plasma processing apparatus including: a processing container configured to be evacuated; an outer upper electrode provided annularly to face a lower electrode on which a substrate is placed in the processing container; an inner upper electrode disposed to be insulated inside the outer upper electrode in a radial direction; a processing gas supply unit configured to supply a processing gas to a processing space between the outer upper electrode and the inner upper electrode, and the lower electrode; a first high-frequency power supply configured to output a first high-frequency wave having a frequency suitable for generating plasma of the processing gas; a first power feeding unit provided with a cylindrical conductive member consecutively connected to the outer upper electrode in a circumferential direction, and configured to apply the first high-frequency wave outputted from the first high-frequency power supply to the outer upper electrode through the cylindrical conductive member; a second power feeding unit provided with a rod-shaped central conductive member connected to the center of the inner upper electrode, and configured to branch the first high-frequency wave outputted from the first high-frequency power supply from the first power feeding unit to supply the branched-off first high-frequency wave to the inner upper electrode through the central conductive member; a variable condenser provided in the second power feeding unit to adjust a ratio of a power supplied to the plasma through the outer upper electrode and a power supplied to the plasma through the inner upper electrode; a variable condenser control unit configured to control a capacitance of the variable condenser stepwise; and an interelectrode gap adjusting unit configured to variably adjust an interelectrode gap between the outer upper electrode and the inner upper electrode, and the lower electrode. The first and second power feeding units, a fixed condenser formed between the outer upper electrode and the inner upper electrode, and a closed circuit including the variable capacitor substantially become a resonance state with respect to the first high-frequency wave when the variable condenser has a capacitance value in a predetermined resonance region. The method includes: selectively using a capacitance value in a first region lower than the resonance region of the variable condenser and a capacitance value in a second region higher than the resonance region, depending on the interelectrode gap, to perform the plasma processing.

In the above-mentioned configuration, the utility of the variable condenser positioning variable adjustment function in the present disclosure may be further expanded in combination with the interelectrode gap adjustment function.

Effect of the Invention

According to the plasma processing method of the present disclosure, by such the configuration and the operation, in the capacitively coupled plasma processing apparatus that distributes and supplies the high-frequency power to the inner upper electrode and the outer upper electrode disposed to face the lower electrode on which the substrate is placed, the function can be remarkably improved as the adjustment knob for controlling the plasma density distribution characteristic of the variable condenser provided to control the outer/inner power distribution ratio or the in-plane profile of the process characteristic.

DETAILED DESCRIPTION TO EXECUTE THE INVENTION

Hereinafter, suitable exemplary embodiments of the present invention will be described in detail with reference to the accompanying drawings.

Figure 1:
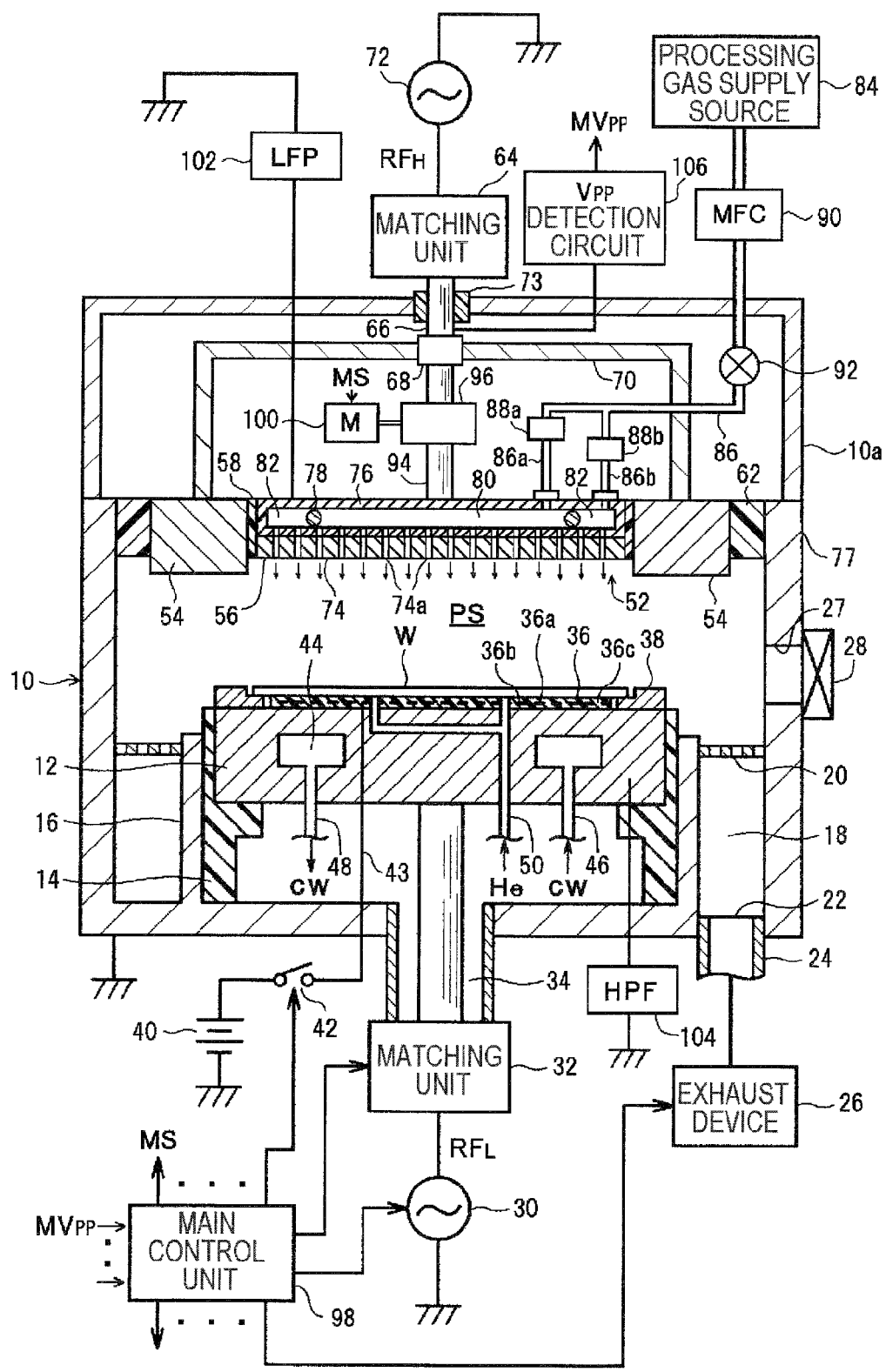
FIG. 1 is a cross-sectional view illustrating a configuration of a plasma processing apparatus according to an exemplary embodiment of the present disclosure.

FIG. 1 illustrates a configuration of a plasma processing apparatus according to an exemplary embodiment of the present disclosure. The plasma processing apparatus is configured as a capacitively coupled plasma etching apparatus and includes, for example, a cylindrical chamber (processing container) 10 made of aluminum, of which the surface is alumite-processed (anodized). The chamber 10 is grounded.

A disk-shaped susceptor 12, on which a processing target substrate, for example, a semiconductor wafer W is placed, is horizontally disposed at the center of the chamber 10, as a substrate holding plate which may also serve as a high-frequency electrode. The susceptor 12 is made of, for example, aluminum and is supported on an insulative cylindrical supporter 14 that extends vertically upwards from the bottom of the chamber 10.

An annular exhaust path 18 is formed along the outer periphery of the insulative tubular supporter 14 between the conductive tubular supporter 16 that extends vertically upwards from the bottom of the chamber 10 and an inner wall of the chamber 10. An annular baffle plate 20 is attached to the top or an inlet of the exhaust path 18, and an exhaust port 22 is provided on the bottom. A plurality of exhaust ports 22 may be provided at a regular interval in a circumferential direction so as to axisymmetrically maintain a uniform flow of gas in the chamber 10 in relation to the semiconductor wafer W on the susceptor 12.

An exhaust device 26 is connected to each exhaust port 22 through an exhaust pipe 24. The exhaust device 26 includes a vacuum pump such as, for example, a turbo molecular pump and may decompress a plasma processing space in the chamber 10 to a desired vacuum degree. A gate valve 28 is attached outside a side wall of the chamber 10 to open/close a carry-in/out port 27 of the semiconductor wafer W.

An RF bias lower high-frequency power supply 30 is electrically connected to the susceptor 12 through a lower matching unit 32 and a lower power feeding rod 34. The lower high-frequency power supply 30 is configured to output at variable power high-frequency waves $RF_L$ having a predetermined frequency (in general, 13.56 MHz or less, for example, 2 MHz) suitable for controlling energy of ions drawn into the semiconductor wafer W. The lower matching unit 32 accommodates a reactance variable matching circuit for matching between impedance at the lower high-frequency power supply 30 side and impedance at a load (primarily, the susceptor, plasma, and the chamber) side.

An electrostatic chuck 36 is provided on the top surface of the susceptor 12 to hold the semiconductor wafer W with an electrostatic attraction force, and a focus ring 38 is provided outside the electrostatic chuck 36 in a radial direction to surround the periphery of the semiconductor wafer W in a ring shape. The electrostatic chuck 36 is configured by inserting an electrode 36a formed of a conductive film between a pair of insulating films 36b, 36c, and a high-voltage DC power supply 40 is electrically connected to the electrode 36a through a switch 42 and a coated wire 43. The semiconductor wafer W may be attracted and held on the electrostatic chuck 36 by an electrostatic force by high DC voltage applied from the DC power supply 40.

For example, an annular coolant chamber or a coolant path 44 extending in a circumferential direction is provided within the susceptor 12. Coolant having a predetermined temperature, for example, cooling water cw is circulated and supplied to the coolant path 44 from a chiller unit (not illustrated) through pipes 46, 48. A processing temperature of the semiconductor wafer W on the electrostatic chuck 36 may be controlled by the temperature of the coolant. In this regard, a heat transfer gas from a heat transfer gas supplying unit (not illustrated), for example, He gas, is supplied to a portion between the top surface of the electrostatic chuck 36 and a rear surface of the semiconductor wafer W through a gas supply pipe 50. A lift pin that is vertically movable through the susceptor 12 and an elevation mechanism (not illustrated) thereof are provided to load/unload the semiconductor wafer W.

An upper electrode 52 is provided above the susceptor (lower electrode) 12 to face the susceptor in parallel. A space between both electrodes 12, 52 is a plasma generation space or a processing space PS. The upper electrode 52 forms a surface in contact with the plasma generation space PS, that is, an opposite surface by facing the semiconductor wafer W on the susceptor (lower electrode) 12. The upper electrode 52 is constituted by a ring-shaped or donut-shaped outer upper electrode 54 disposed to face the susceptor 12 by a predetermined interval and a disk-shaped inner upper electrode 56 insulated and disposed inside the outer upper electrode 54 in a radial direction.

Figure 2:
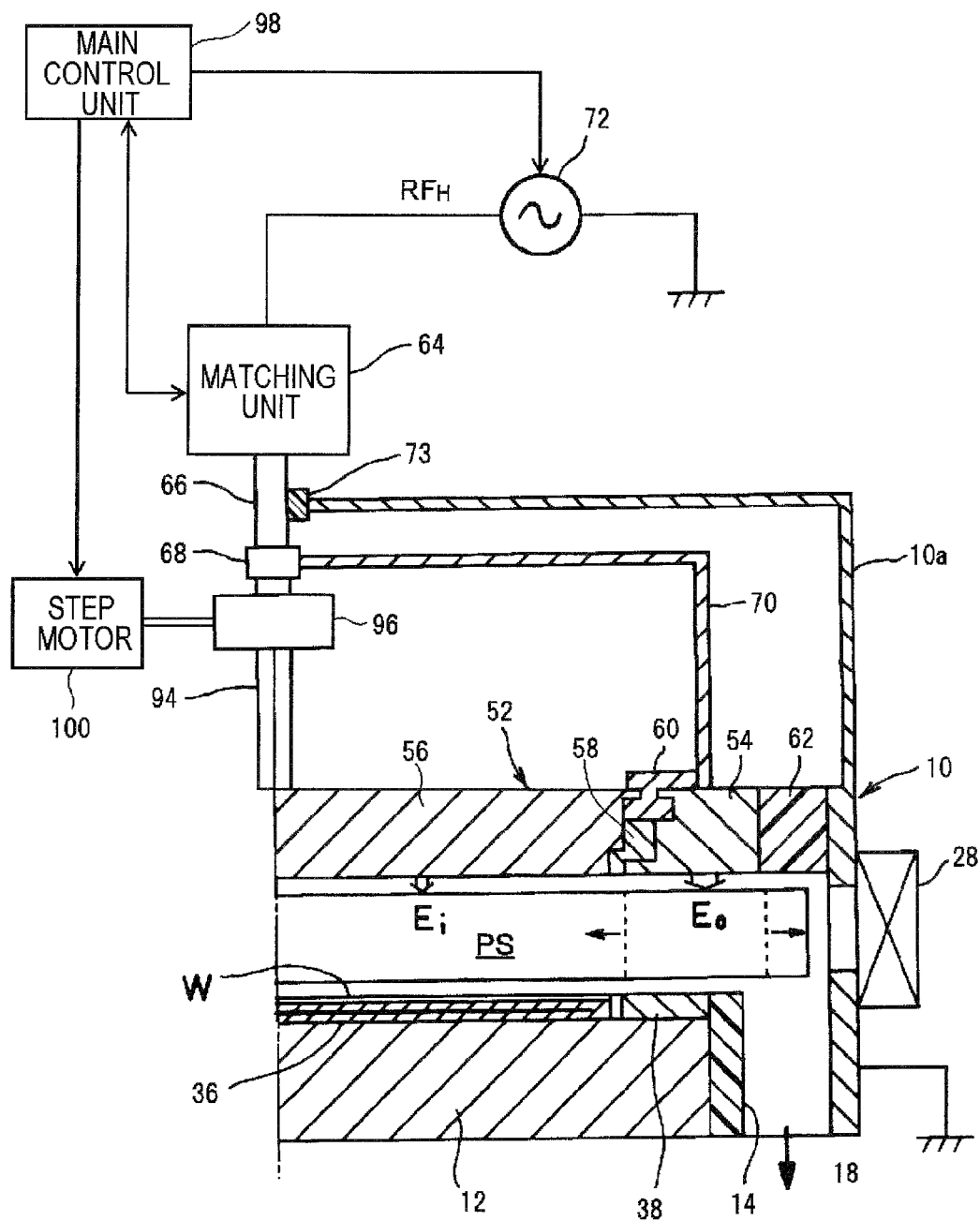
FIG. 2 is a view illustrating a configuration of a high-frequency power feeding unit in the plasma processing apparatus of FIG. 1.

FIG. 2 illustrates a configuration of an upper high-frequency power feeding unit in the plasma processing apparatus. As illustrated in FIG. 2, an annular gap (clearance) having a size of, for example, 0.25 mm to 2.0 mm is formed between the outer upper electrode 54 and the inner upper electrode 56, and a dielectric 58 made of, for example, quartz, is provided in the gap. Ceramics 60 may be provided in the gap. A fixed condenser (electrostatic capacitor) $C_{58}$ is formed between both electrodes 54, 56 with the dielectric 58 therebetween. Capacitance of the condenser $C_{58}$ is selected or adjusted to be a desired value according to the size of the gap and a dielectric constant of the dielectric 58. An annular insulative sealing member 62 made of, for example, alumina ($Al_2O_3$) is air-tightly attached between the outer upper electrode 54 and the side wall of the chamber 10.

The outer upper electrode 54 may be configured by a low-resistance conductor or semiconductor having small Joule heat, for example, silicon. An upper high-frequency power supply 72 is electrically connected to the outer upper electrode 54 through an upper matching unit 64, a first upper power feeding rod 66, a connector 68, and a power feeding cylinder (cylindrical conductive member) 70. The upper high-frequency power supply 72 outputs high-frequency waves $RF_H$ having a frequency (in general, 27 MHz or more, for example, 60 MHz) suitable for discharging the processing gas, that is, generating plasma. The upper matching unit 64 accommodates a reactance variable matching circuit for matching between impedance at the upper high-frequency power supply 72 side and impedance at the load (primarily, the susceptor, the plasma, and the chamber) side. An output terminal of the upper matching unit 64 is connected to the top of the first upper power feeding rod 66.

The power feeding cylinder 70 is constituted by a conductive plate having a cylindrical shape, a conical shape, or a shape similar thereto, for example, an aluminum plate or a copper plate, and the bottom of the power feeding cylinder 70 is consecutively connected to the outer upper electrode 54 in a circumferential direction and the top thereof is electrically connected to the lower end of the first upper power feeding rod 66 by the connector 68. Outside the power feeding cylinder 70, the side wall of the chamber 10 extends to a higher side than a height position of the upper electrode 52, thereby constituting a cylindrical ground conductor 10a. The top of the cylindrical ground conductor 10a is electrically insulated from the first upper power feeding rod 66 by a tubular insulating member 73. In such a configuration, in a load circuit viewed from the connector 68, a coaxial line is formed by the power feeding cylinder 70, the outer upper electrode 54, and the cylindrical ground conductor 10a, in which the power feeding cylinder 70 and the outer upper electrode 54 are used as a waveguide.

Referring back to FIG. 1, the inner upper electrode 56 includes an electrode plate 74 which includes a plurality of gas ejecting holes 74a, and is made of, for example, a semiconductor material such as Si or SiC, and an electrode support 76 made of a conductive material which detachably supports the electrode plate 74, for example, aluminum, of which the surface is alumite-processed. Two gas introducing chambers divided by an annular partition member 78 constituted by, for example, an O-ring, that is, a central gas introducing chamber 80 and a peripheral gas introducing chamber 82 are provided within the electrode support 76. A central shower head is constituted by the central gas introducing chamber 80 and the plurality of gas ejecting holes 74a provided on the bottom thereof, and a peripheral shower head is constituted by the peripheral gas introducing chamber 82 and the plurality of gas ejecting holes 74a provided on the bottom thereof.

A processing gas is supplied to the gas introducing chambers 80, 82 from a common processing gas supply source 84 at a desired flow rate ratio. In more detail, a gas supply pipe 86 continued from the processing gas supply source 84 is divided into two branch pipes 86a, 86b to be connected to the gas introducing chambers 80, 82, and flow control valves 88a, 88b are provided in the middle of the branch pipes 86a, 86b, respectively. Since conductances of paths up to the gas introducing chambers 80, 82 from the processing gas supply source 84 are equal to each other, a flow rate ratio of the processing gases to be supplied to both gas introducing chambers 80, 82 may be arbitrarily adjusted by adjusting the flow control valves 88a, 88b. A mass flow controller (MFC) 90 and an opening/closing valve 92 are provided in the middle of the gas supply pipe 86.

As described above, by adjusting the flow rate ratio of the processing gases to be introduced into the central gas introducing chamber 80 and the peripheral gas introducing chamber 82, a ratio of a flow rate of a gas ejected from the gas ejecting holes 74a of an electrode center corresponding to the central gas introducing chamber 80, that is, a central shower head and a flow rate of a gas ejected from the gas ejecting holes 74a of an electrode periphery corresponding to the peripheral gas introducing chamber 82, that is, a peripheral shower head may be arbitrarily adjusted. Flow rates per unit area of the processing gases ejected from the central shower head and the peripheral shower head may be different from each other. Each of gas species or gas mixture ratios of the processing gases ejected from the central shower head and the peripheral shower head may be independently or individually selected.

The upper high-frequency power supply 72 is electrically connected to the electrode support 76 of the inner upper electrode 56 through the upper matching unit 64, the first upper power feeding rod 66, the connector 68, and a second upper power feeding rod (central conductive member) 94. A variable condenser 96 is provided in the middle of the second upper power feeding rod 94 to variably control the capacitance. The capacitance of the variable condenser 96 is variably controlled within a predetermined range through a step motor (M) 100 by a main control unit 98.

A low-pass filter (LPF) 102 is electrically connected to the inner upper electrode 56 to pass the high-frequency waves (2 MHz) from the lower high-frequency power supply 30 through a ground without passing the high-frequency waves (60 MHz) from the upper high-frequency power supply 72. The low-pass filter (LPF) 102 may be constituted by an LR filter or an LC filter, but may be constituted by only one wire which may provide a sufficiently large reactance to the high-frequency waves (60 MHz) from the upper high-frequency power supply 72. Meanwhile, a high-pass filter (HPF) 104 is electrically connected to the susceptor 12 to pass the high-frequency waves (60 MHz) from the upper high-frequency power supply 72 through the ground.

The main control unit 98 is constituted by a computer system including a CPU or a memory, and controls individual operations of the respective units within the apparatus, in particular, for example, the high-frequency power supplies 30, 72, the processing gas supply source 84, and the matching units 32, 64, the step motor (M) 100, and an overall operation (sequence) of the apparatus.

In the plasma processing apparatus, a peak value detection circuit 106 is connected to the first upper power feeding rod 66 at an output side of the upper matching unit 64 to detect a peak-to-peak value $V_{PP}$ of the high-frequency wave $RF_H$ applied to the upper electrode 52 (54, 56) from the upper high-frequency power supply 72. The main control unit 98 receives a $V_{PP}$ measurement value $MV_{PP}$ from the peak value detection circuit 106 and uses the received $V_{PP}$ measurement value $MV_{PP}$ in variable adjustment of the capacitance of the variable condenser 96, and furthermore, in interlocking to be described below.

In the plasma processing apparatus, a semiconductor wafer W to be processed is first carried into the chamber 10 and is placed on the electrostatic chuck 36 while the gate valve 28 is opened in order to perform etching. Subsequently, the inside of the chamber 10 is exhausted by the exhaust device 26, an etching gas (in general, a mixed gas) is introduced from the processing gas supply source 84 into the gas introducing chambers 80, 82 at a predetermined flow rate and a predetermined flow rate ratio, and a pressure within the chamber 10 is maintained at a set value by the exhaust device 26. Next, RF bias high-frequency waves (2 MHz) $RF_L$ are applied to the susceptor 12 from the lower high-frequency power supply 30 at predetermined power, and subsequently, the plasma generating high-frequency waves (60 MHz) $RF_H$ are also applied to the upper electrode 52 (54, 56) from the upper high-frequency power supply 72 at predetermined power. The heat transfer gas (He gas) is supplied to a contact interface between the electrostatic chuck 36 and the semiconductor wafer W from the heat transfer gas supply unit, and an electrostatic chuck switch 42 is turned ON to confine the heat transfer gas in the contact interface by the electrostatic attraction force. The etching gas ejected from the gas ejecting holes 74a of the inner upper electrode 56 is discharged under a high-frequency electric field from the upper electrode 52 (54, 56) within the processing space PS to thereby generate plasma. A processing target surface of the semiconductor wafer W is etched by radicals or ions included in the plasma.

Figure 3:
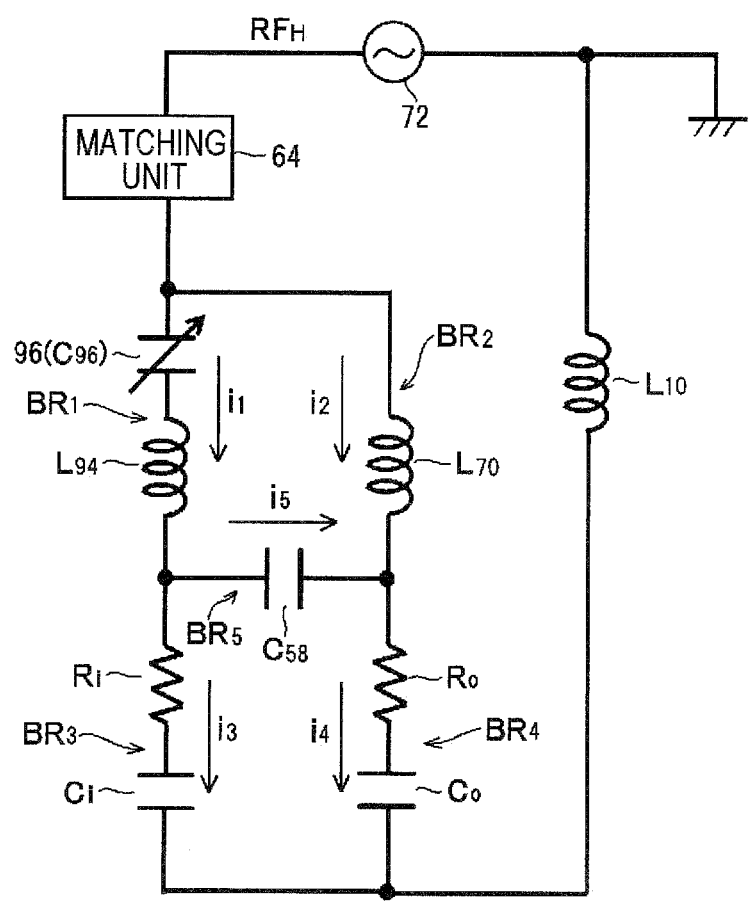
FIG. 3 is a circuit diagram illustrating an equivalent circuit of the high-frequency power feeding unit.

FIG. 3 illustrates an equivalent circuit of the upper high-frequency power feeding unit in the plasma processing apparatus. In the equivalent circuit, an inductor $L_{70}$ has an inductance of the power feeding cylinder 70, an inductor $L_{94}$ has an inductance of the second upper power feeding rod 94, and a fixed condenser $C_{58}$ has electrostatic capacitance formed between the outer upper electrode 54 and the inner upper electrode 56 with the dielectric 58 interposed therebetween. The inductors $L_{70}$, $L_{94}$, the fixed condenser $C_{58}$, and the variable condenser 96 ($C_{96}$) form a closed-loop LC circuit. Resistances $R_o$, $R_i$ and the condensers $C_o$, $C_i$ represent the resistance and capacitance of ion sheathes formed just below the outer upper electrode 54 and the inner upper electrode 56, respectively. An inductor $L_{10}$ of a feedback circuit has the inductance of the chamber 10.

Figure 4A:
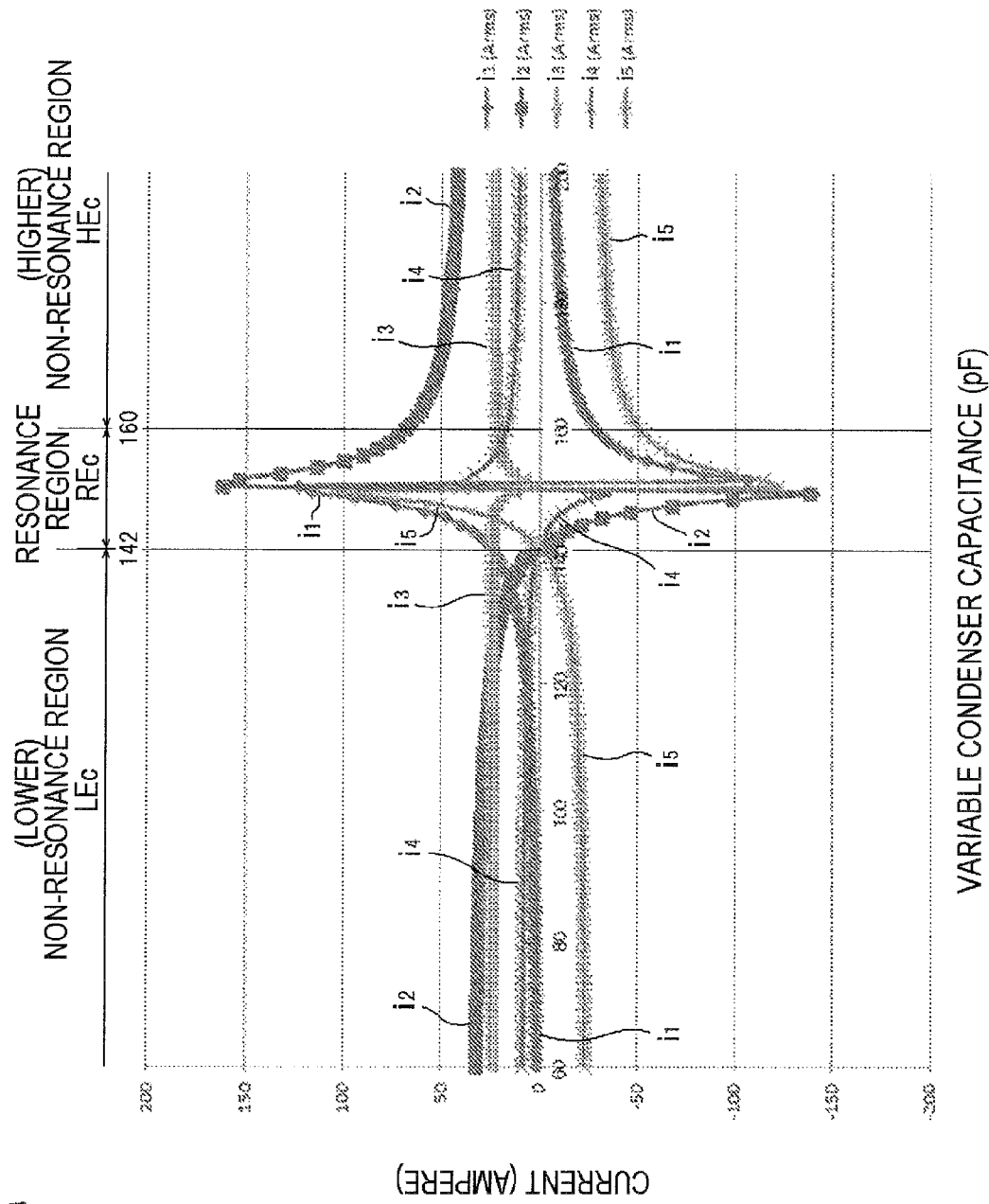
FIG. 4A is a graph illustrating variable condenser capacitance-branch current characteristics in the equivalent circuit.
Figure 4B:
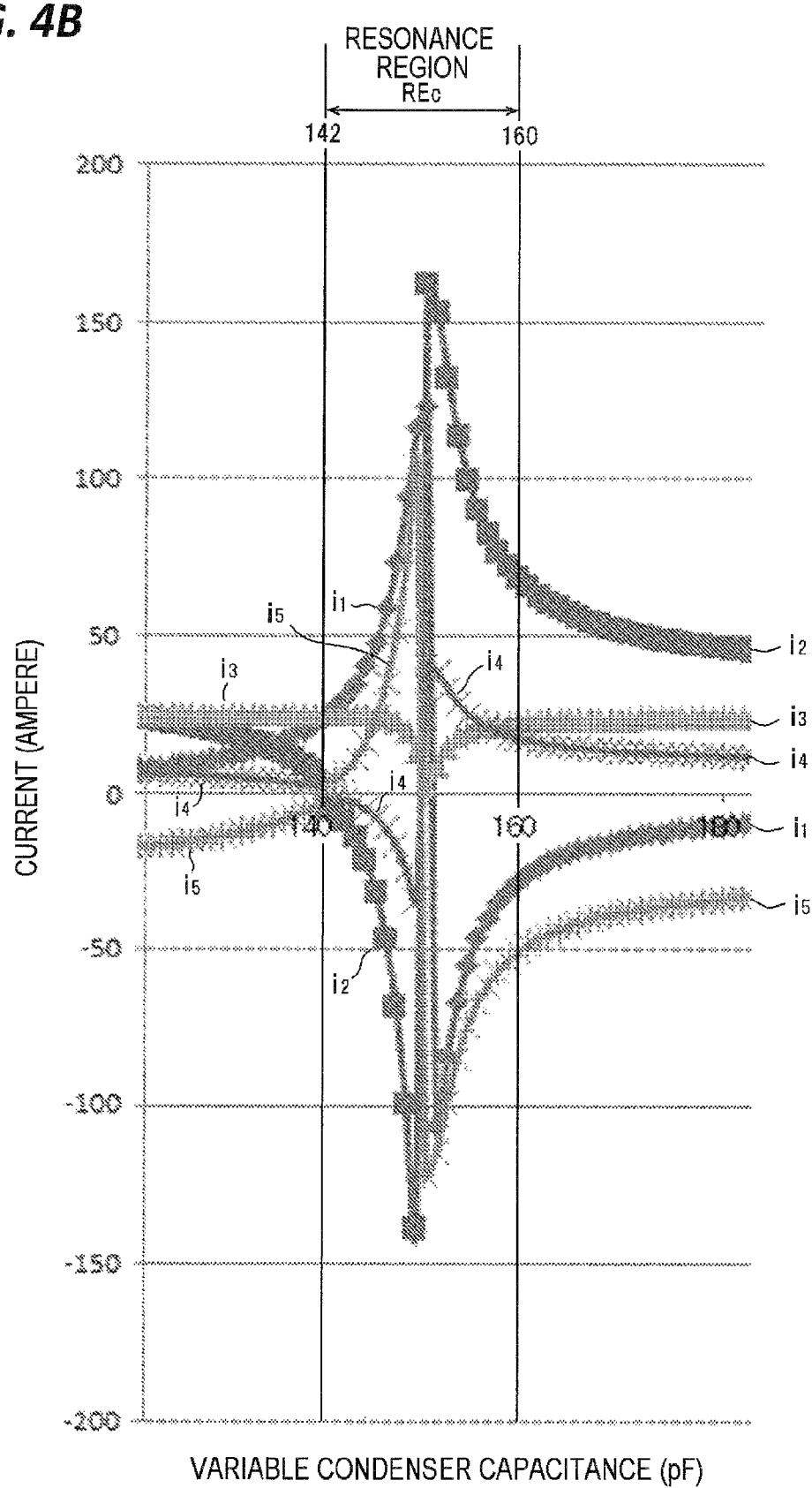
FIG. 4B is a graph illustrating a part (resonance region) of FIG. 4A in an enlarged scale.

In the equivalent circuit, a current value of a current flowing on each branch varies depending on the variable condenser capacitance $C_{96}$. FIGS. 4A and 4B illustrate exemplary variable condenser capacitance-branch current characteristics. In the figures, the horizontal axis represents a value of the capacitance $C_{96}$ of the variable condenser 96, and the vertical axis represents a current value of a current $i_1$, $i_2$, $i_3$, $i_4$, or $i_5$ of each branch. Herein, $i_1$ represents a current that flows on a first branch $BR_1$ with the variable condenser 96 and the inductor $L_{94}$, $i_2$ represents a current that flows on a second branch $BR_2$ with the inductor $L_{70}$, $i_3$ represents current that flows on a third branch $BR_3$ with a resistor $R_i$ and a condenser $C_i$, $i_4$ represents a current that flows on a fourth branch $BR_4$ with a resistor $R_o$ and a condenser $C_o$, and $i_5$ represents a current that flows on a fifth branch $BR_5$ with the fixed condenser $C_{58}$.

As illustrated in FIG. 4A, when the capacitance $C_{96}$ of the variable condenser 96 is in a region of approximately 130 pF or less (when $C_{96}$<130 pF), the current $i_1$, $i_2$, $i_3$, $i_4$, or $i_5$ of each unit is hardly changed regardless of any change in the value of the variable condenser capacitance $C_{96}$. In particular, the current $i_3$ of the third branch $BR_3$ supplied to the plasma from the inner upper electrode 56 is hardly changed. The current $i_4$ of the fourth branch $BR_4$ supplied to the plasma from the outer upper electrode 54 is hardly changed in a region of $C_{96}$<120 pF, and when $C_{96}$ is more than approximately 120 pF, the current $i_4$ starts to decreases gently. The current $i_5$ of the fifth branch $BR_5$ has a negative polarity and flows in an opposite direction to an arrow of FIG. 3.

However, when the variable condenser capacitance $C_{96}$ is more than approximately 130 pF, each of the currents $i_1$ and $i_5$ of the first and fifth branches $BR_1$ and $BR_5$ exponentially increases in a sharp curve, while the current $i_2$ of the second branch $BR_2$ exponentially decreases in a sharp curve, and the current $i_4$ of the fourth branch $BR_4$ also exponentially decreases in a slightly sharp curve. However, the current $i_3$ of the third branch $BR_3$ is hardly changed and a present value is maintained. The current $i_3$ decreases only when the variable condenser capacitance $C_{96}$ comes very close to a resonance point ($C_{96} \approx 152$ pF) (approximately 150 pF).

As illustrated in FIGS. 4A and 4B, in the illustrated example, each of the currents $i_1$ and $i_5$ of the first and fifth branches $BR_1$ and $BR_5$ reaches the highest value or the maximum value at approximately the resonance point ($C_{96} \approx 152$ pF). When the variable condenser capacitance $C_{96}$ is slightly changed (increases) therefrom, each of the currents $i_1$ and $i_5$ is inverted to the lowest value or the minimum value at a burst, and exponentially increases therefrom according to the increase of the variable condenser capacitance $C_{96}$. As a result, each of the currents $i_1$ and $i_5$ gradually comes close to a predetermined value (saturation value) according to the increase of the variable condenser capacitance $C_{96}$ in a region of $C_{96} > 160$ pF. However, the current $i_1$ of the first branch $BR_1$ flows in an inverse direction to a direction when $C_{96} < 130$ pF. A flow direction of the current $i_5$ of the fifth branch $BR_5$ is the same as the flow direction when $C_{96} < 130$ pF, but a current value (saturation value) of the current $i_5$ becomes larger than the current value when $C_{96} < 130$ pF.

Each of the currents $i_2$ and $i_4$ of the second and fourth branches $BR_2$ and $BR_4$ reaches the lowest value or the minimum value at approximately the resonance point ($C_{96} \approx 152$ pF). When the variable condenser capacitance $C_{96}$ is slightly changed (increases) therefrom, each of the currents $i_2$ and $i_4$ is inverted to the highest value or the maximum value at a burst, and exponentially decreases therefrom according to the increase of the variable condenser capacitance $C_{96}$. As a result, each of the currents $i_2$ and $i_4$ gradually comes close to a predetermined value (saturation value) according to the increase of the variable condenser capacitance $C_{96}$, in the region of $C_{96} > 160$ pF. However, both the currents $i_2$ and $i_4$ of the second and fourth branches $BR_2$ and $BR_4$ become larger than the currents $i_2$ and $i_4$ when $C_{96} < 130$ pF.

Meanwhile, the current $i_3$ of the third branch $BR_3$ reaches the lowest value or the minimum value at approximately the resonance point ($C_{96} \approx 152$ pF), and the current $i_3$ exponentially increases according to the increase of the variable condenser capacitance $C_{96}$ therefrom. However, the current $i_3$ is not inverted to the highest value or the maximum value, but gradually comes close to a value which is substantially equal to the current $i_3$ when $C_{96} < 130$ pF.

In the illustrated example, a region of pF in a range of approximately 142 pF $< C_{96} <$ 160 pF becomes a resonance region $RE_C$ around the resonance point ($C_{96} \approx 152$ pF). In the resonance region $RE_C$, as described above, even if the variable condenser capacitance $C_{96}$ is slightly changed, the currents $i_1$ to $i_5$ that flow on the branches $BR_1$ to $BR_5$, respectively, of the upper high-frequency power feeding unit are significantly changed. Accordingly, a ratio of the currents $i_4$ and $i_3$ that flow on the fourth and third branches $BR_4$ and $BR_3$ corresponding to a power distribution ratio of the outer upper electrode 54 and the inner upper electrode 56, that is, an outer/inner power distribution ratio $P_o/P_i$, that is, an outer/inner current ratio $i_4/i_3$ is also significantly changed at a rapid change rate (inclination). As a result, fine adjustment is difficult.

In the resonance region $RE_C$, since the current $i_1$ of the first branch $BR_1$ largely swings between the highest value (maximum value) and the lowest value (minimum value), the variable condenser 96 may be damaged. Accordingly, in the plasma processing apparatus, since it is undesirable that the variable condenser capacitance $C_{96}$ is set in the resonance region $RE_C$ to perform a plasma processing, or while the plasma processing is performed, the value of the variable condenser capacitance $C_{96}$ is variably adjusted to be put in the resonance region $RE_C$ or pass through the resonance region $RE_C$, interlocking is performed in the main control unit 98.

Figure 5:
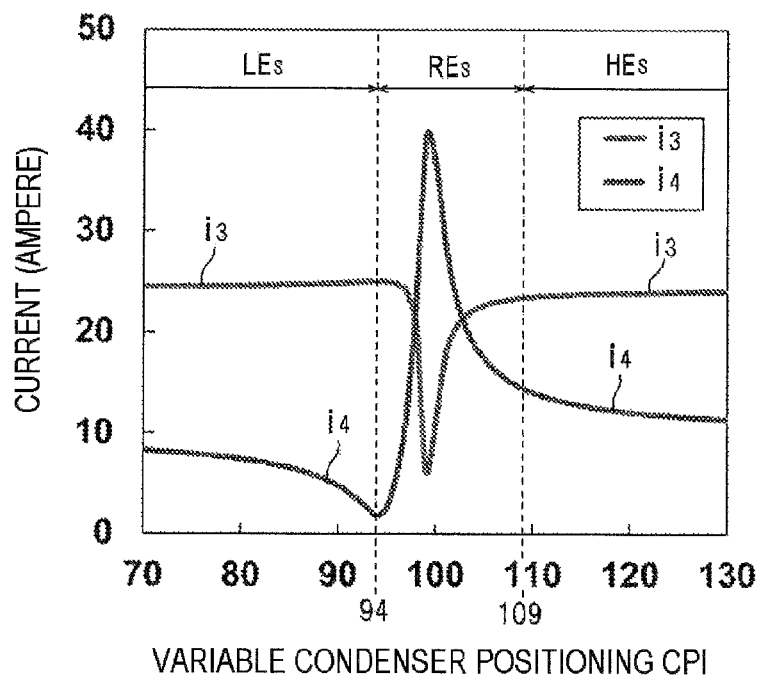
FIG. 5 is a view illustrating inner current and outer current characteristics in the equivalent circuit.
Figure 6:
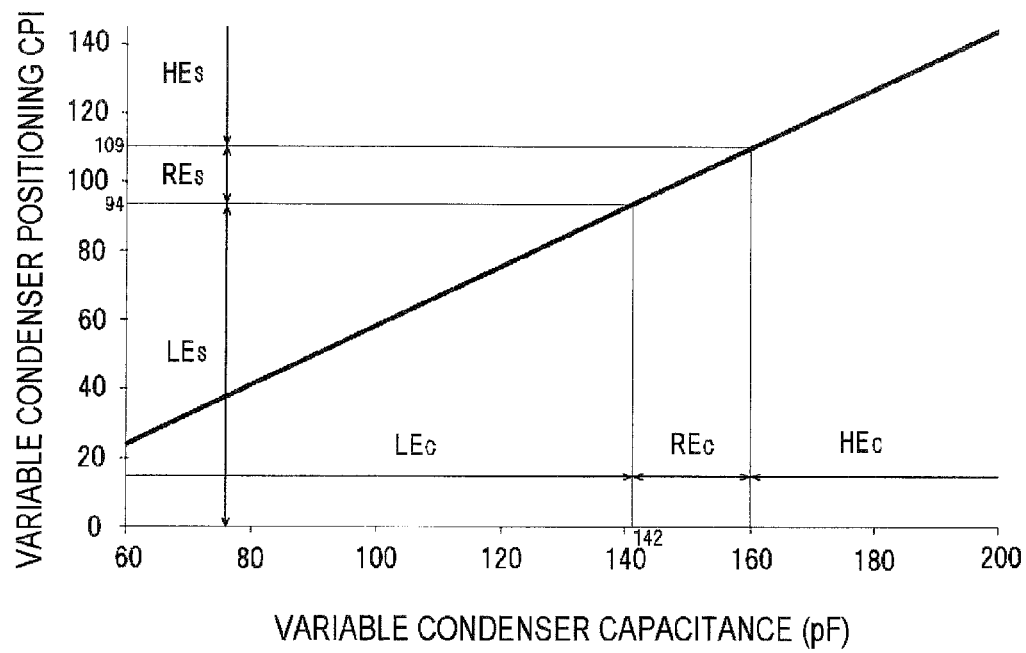
FIG. 6 is a view illustrating a correspondence relationship between a variable condenser capacitance and a variable condenser positioning in a variable condenser.

FIG. 5 illustrates the respective characteristics of the current (inner current) $i_3$ of the third branch $BR_3$ and the current (outer current) $i_4$ of the fourth branch $BR_4$ extracted from the graphs of FIGS. 4A and 4B in comparison with each other. The horizontal axis represents a value of a variable condenser positioning CPI of the variable condenser 96. Herein, the variable condenser positioning CPI is a control variable at the variable condenser 96 side viewed from the main control unit 98 (that is, directly controllable) when the main control unit 98 variably controls the capacitance $C_{96}$ of the variable condenser 96 through the step motor (M) 100, and is generally given a step number (integer) which is continued within a predetermined range. And, a linear corresponding relationship is provided between the capacitance $C_{96}$ of the variable condenser 96 and the variable condenser positioning CPI as illustrated in FIG. 6. A resonance region $RE_S$ of the variable condenser positioning CPI which corresponds to the resonance region $RE_C$ (142 pF $< C_{96} <$ 160 pF) of the variable condenser capacitance $C_{96}$ is in the range of 94 $<$ CPI $<$ 109.

As illustrated in FIG. 5, in a (first) lower non-resonance region $LE_S$ (CPI $<$ 94) lower than the resonance region $RE_S$, the current value of the inner current $i_3$ is hardly changed, but substantially constant (approximately 24 amperes). In contrast, when the current value of the outer current $i_4$ comes close to the resonance region $RE_S$, that is, when the variable condenser positioning CPI is more than 70, the current value of the outer current $i_4$ monotonously decreases in a gentle curve from a previous saturation value (approximately 8 amperes). Accordingly, in the lower non-resonance region $LE_S$ (CPI $<$ 94), the outer/inner current ratio $i_4/i_3$ is hardly changed and is substantially constant (approximately 0.33) regardless of any change in the variable condenser positioning CPI when the variable condenser positioning CPI is 70 or less. When the variable condenser positioning CPI is more than 70, the outer/inner current ratio $i_4/i_3$ gradually decreases and thus becomes approximately 0.15 just before the resonance region $RE_S$ (CPI=93). That is, a variable range of the outer/inner current ratio $i_4/i_3$ is approximately 0.15 to approximately 0.33.

In a (second) higher non-resonance region $HE_S$ (CPI $>$ 109) higher than the resonance region $RE_S$, the current value of the inner current $i_3$ is hardly changed, but substantially constant (approximately 24 amperes). In contrast, as the current value of the outer current $i_4$ goes far away from the resonance region $RE_S$, the current value of the outer current $i_4$ monotonously decreases in a gentle curve and gradually comes close to a constant saturation value (approximately 12 amperes). Accordingly, in the higher non-resonance $LE_S$ (CPI $>$ 109), a variable range of the outer/inner current ratio $i_4/i_3$ is approximately 0.48 to approximately 0.50.

In the non-resonance regions $LE_S$ and $HE_S$, the outer/inner current ratio $i_4/i_3$ is always $i_4/i_3 < 1$, and the outer/inner power distribution ratio $P_o/P_i$ is also always $P_o/P_i < 1$. However, a ratio of an electric field intensity $E_o$ just below the outer upper electrode 54 and an electric field intensity $E_i$ just below the inner upper electrode 56, that is, an outer/inner electric field intensity ratio $E_o/E_i$ is always $E_o/E_i > 1$. That is, since an area $S_{54}$ of the outer upper electrode 54 is markedly smaller than an area $S_{56}$ of the inner upper electrode 56 (generally, $1/10$ or less), an RF power density per unit area in the outer upper electrode 54, $P_o/S_{54}$ (moreover, the electric field intensity $E_o$ just below) is higher than an RF power density per unit area in the inner upper electrode 56, $P_i/S_{56}$ (moreover, the electric field intensity Ei just below).

As described above, in any of the lower non-resonance region $LE_S$ (CPI<94) and the higher non-resonance region $HE_S$ (CPI>109) which are substantial use regions of the variable condenser 96, a variable range or a dynamic range of the outer/inner current ratio $i_4/i_3$ is not large. In the related art, since only one region, in particular, the lower non-resonance region $LE_S$ (CPI<94) is primarily used, the outer/inner power distribution ratio $P_o/P_i$ may not arbitrarily be varied as expected, and as a result, an effect as an adjustment knob for controlling a plasma density distribution or an etching characteristic in a radial direction is slightly insufficient.

In this regard, in the exemplary embodiment, by selectively using the lower non-resonance region $LE_S$ (CPI<94) and the higher non-resonance region $HE_S$ (CPI>109), the use region of the variable condenser 96 may be expanded, so that the effect as an adjustment knob for controlling the plasma density distribution or the in-plane profile of the processing characteristic in a radial direction is enhanced, as described below.

EXAMPLE 1

In the plasma processing apparatus of the exemplary embodiment, the present inventors selected four kinds of variable condenser positionings of the variable condenser 96, that is, '36', '93', '110', and '130' and conducted an etching test of a photoresist film using an $SiO_2$ film as a mask. In the etching of the photoresist film, as main process conditions, a mixed gas of $O_2/Ar$ (flow rate 20/200 sccm) was used as an etching gas, the pressure in the chamber 10 was set to 10 mTorr, the output of the upper high-frequency power supply 72 was set to 500 W, and the output of the lower high-frequency power supply 30 was set to 300 W.

Figure 7:
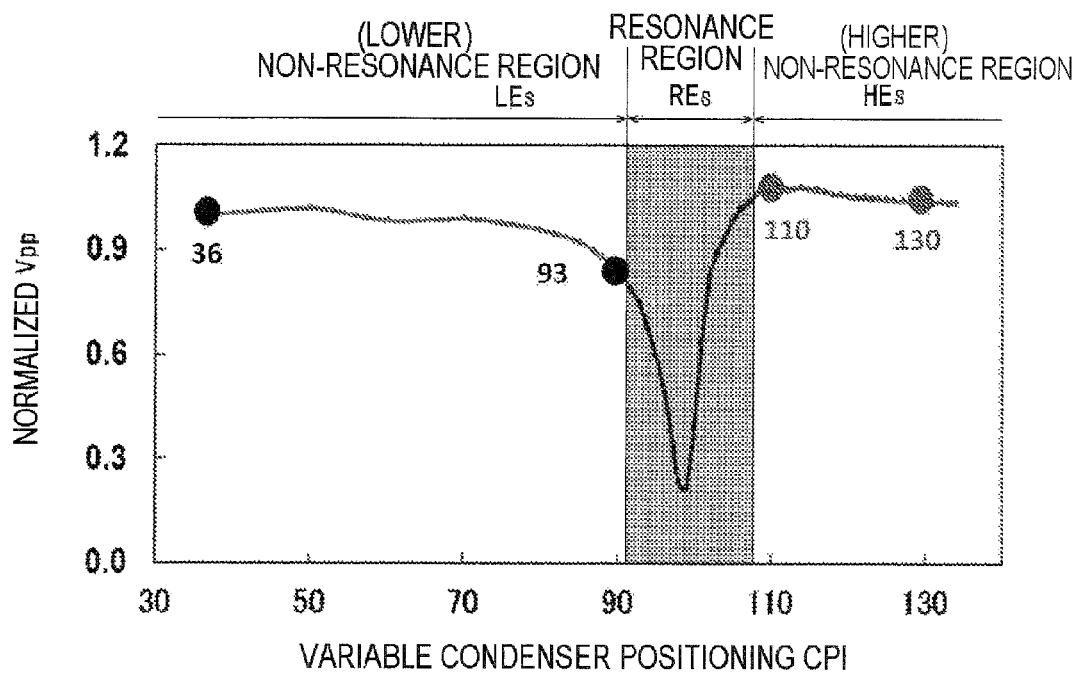
FIG. 7 is a view illustrating a correlation between the variable condenser positioning of the variable condenser and Vpp of a high-frequency wave.

Meanwhile, there is a correlation between the variable condenser positioning CPI of the variable condenser 96 and the peak-to-peak value $V_{pp}$ of the high-frequency waves $RF_H$, as illustrated in FIG. 7. The main control unit 98 has data of the correlation in a table on a memory, and may monitor Vpp through a Vpp detection circuit 106 to perform interlocking when the variable condenser positioning CPI of the variable condenser 96 seems to enter the resonance region RE.

Figure 8:
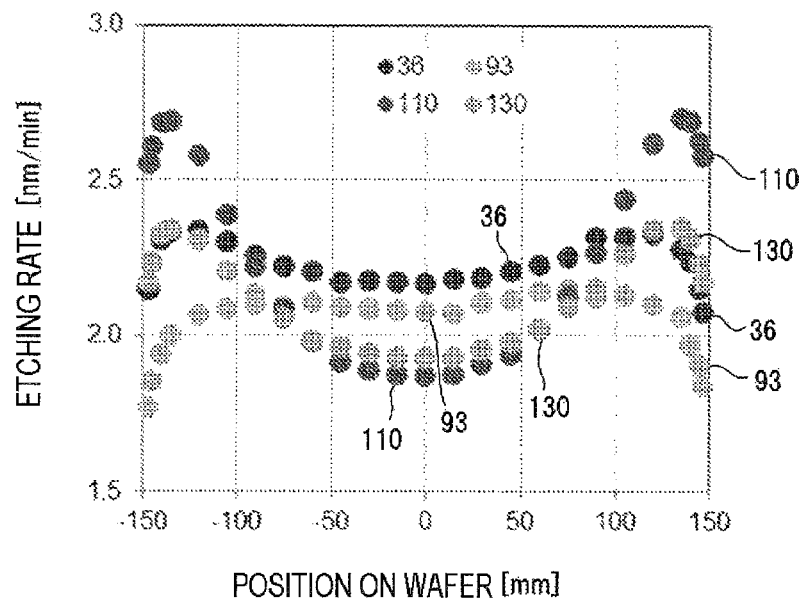
FIG. 8 is a view illustrating an etching rate characteristic (in-plane profile) on a wafer obtained in an etching processing test in an example.

FIG. 8 illustrates an etching rate characteristic (in-plane profile) on a wafer obtained in the etching processing test. As illustrated, when '93' in the lower non-resonance region $LE_S$ is selected as the variable condenser positioning CPI, the etching rate on the wafer becomes relatively higher in the wafer center than in the wafer edge. However, when '36' in the lower non-resonance region $LE_S$ is selected, the tendency of the etching rate to become higher in the wafer center than in the wafer edge is not changed, but the relative difference is considerably reduced. In addition, when '130' in the higher non-resonance region $HE_S$ is selected as the variable condenser positioning CPI, the etching rate on the wafer becomes relatively higher in the wafer center than in the wafer edge, and when '110' in the higher non-resonance region $HE_S$ is selected, the tendency becomes more conspicuous.

Further, in the exemplary embodiment, an intermediate characteristic may be obtained by alternately switching a value in the lower non-resonance region $LE_S$ and a value in the higher non-resonance region $HE_S$ in a single plasma processing on the substrate.

Figure 9A:
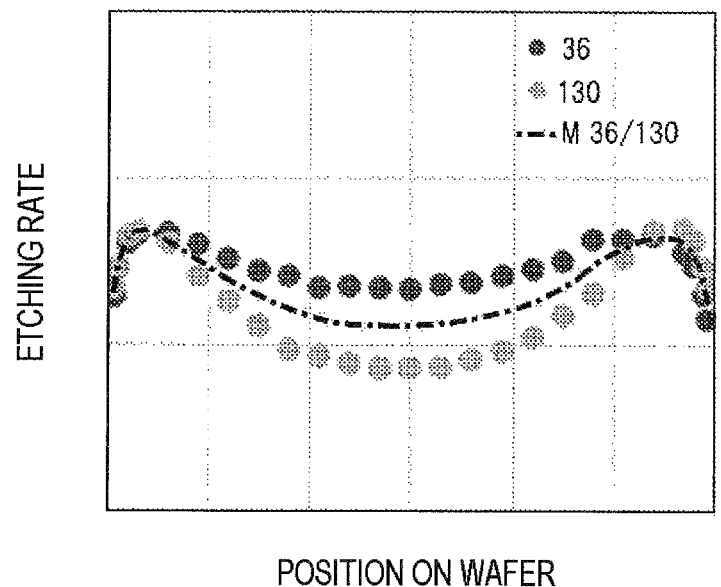
FIG. 9A is a view illustrating an action of a variable condenser positioning variable adjustment function in an exemplary embodiment.
Figure 9B:
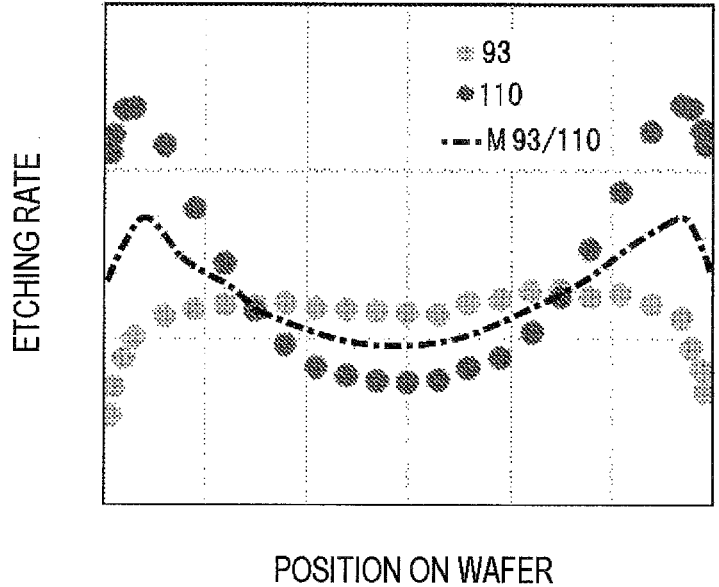
FIG. 9B is a view illustrating another action of the variable condenser positioning variable adjustment function.

For example, assuming that a time required for the etching processing is T, by switching the variable condenser positioning CPI to '36' and '130' half-and-half (T/2), the intermediate characteristic $M_{36/130}$ may be obtained, which is in the middle of the characteristic when the variable condenser positioning CPI is '36' and the characteristic when the variable condenser positioning CPI is '130', as illustrated in FIG. 9A. Or, by switching the variable condenser positioning CPI to '93' and '110' half-and-half (T/2), the intermediate characteristic $M_{93/110}$ may be obtained, which is in the middle of the characteristic when the variable condenser positioning CPI is '93' and the characteristic when the variable condenser positioning CPI is '110', as illustrated in FIG. 9B. Each allocated time is not limited to half-and-half (T/2). For example, an intermediate characteristic around the characteristic obtained when the variable condenser positioning CPI is consistently maintained to a value in the lower non-resonance region $LE_S$, may be obtained by allocating ⅔ T to maintain the variable condenser positioning CPI to a value in the lower non-resonance region $LE_S$ and allocating ⅓ T to maintain the variable condenser positioning CPI to a value in the higher non-resonance region $HE_S$.

Meanwhile, when the variable condenser positioning CPI is switched between the lower non-resonance region LES and the higher non-resonance region HES during the etching processing, the etching processing is temporarily interrupted. The interruption time is usually within 1 to 2 seconds, and does not affect the etching characteristic or results of the etching processing at all.

EXAMPLE 2

In the plasma processing apparatus of the exemplary embodiment, the present inventors selected three kinds of variable condenser positionings of the variable condenser 96, that is, '36', '88', and '110' and conducted an etching test of a multilayer film including an antireflective film (Si) and an organic film (carbon). In a first etching step of the antireflective film (Si), a mixed gas of $CF_4/CHF_3/O_2$ (flow rate 150/75/35 sccm) was used in a processing gas, the pressure in the chamber 10 was set to 10 mTorr, the output of the upper high-frequency power supply 72 was set to 500 W, and the output of the lower high-frequency power supply 30 was set to 50 W. In a second etching step of the organic film (carbon), a mixed gas of $O_2/Ar$ (flow rate 20/200 sccm) was used as an etching gas, the pressure in the chamber 10 was set to 10 mTorr, the output of the upper high-frequency power supply 72 was set to 500 W, and the output of the lower high-frequency power supply 30 was set to 300 W.

Figure 10:
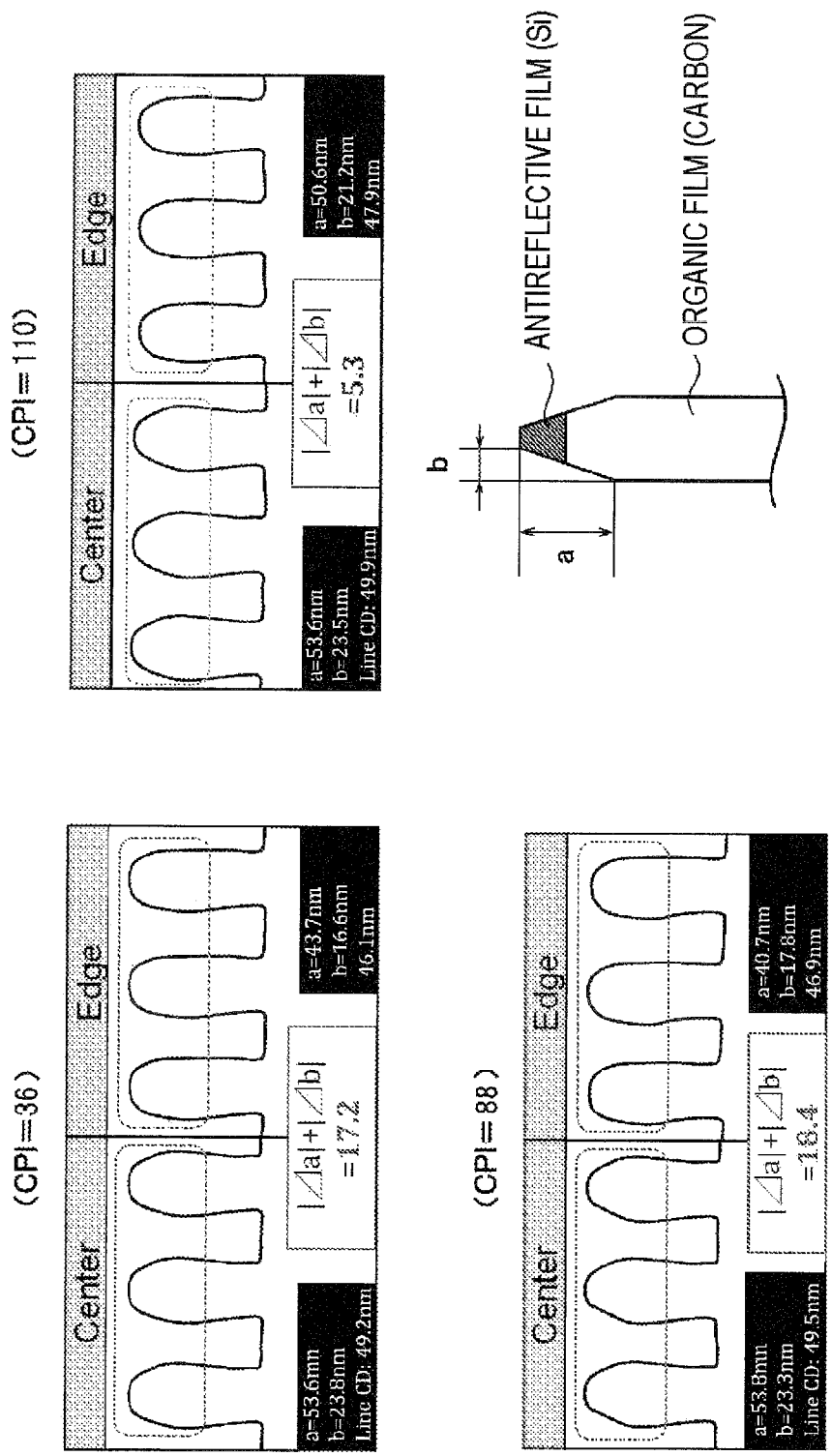
FIG. 10 is a view simulating a cross-sectional SEM photograph of an etched shape obtained in an etching test of a multilayer film in an example.

FIG. 10 illustrates a view simulating a cross-sectional SEM photograph of an etched shape obtained in the etching test of the multilayer film. In the etching of the multilayer film, a pattern transferred to the antireflective film (Si) by the etching of the antireflective film (Si) in the first step is used as a mask for the etching of the organic film (carbon) in the second step. In this case, variation in shoulder collapse (a/b) of the mask in the antireflective film (Si) considerably affects the in-plane uniformity of the etched shape.

In this regard, as illustrated in FIG. 10, in a case of selecting '36' and '88' in the lower non-resonance region $LE_S$ as the variable condenser positionings CPI of the variable condenser 96, variation amounts (($|\Delta a|+|\Delta b|$)) between the wafer center and the wafer edge were 17.2 and 18.4, respectively. In a case of selecting '110' in the higher non-resonance region $HE_S$, the variation amount was 5.3.

Meanwhile, a represents a vertical shoulder collapse of the mask, and Δa represents a difference in values of a between the wafer center and the wafer edge. b represents a horizontal shoulder collapse of the mask, and Δb represents a difference in values of b between the wafer center and the wafer edge. For example, in a case of selecting '110' as the variable condenser positioning CPI, |Δa|+|Δb|=|53.6−50.6|+|23.5−21.2|=5.3.

The 'wafer center' refers to a position that is 0 mm far from the center of the wafer in the radial direction, and the 'wafer edge' refers to a position that is 145 mm far from the center of the wafer (a position 5 mm inside from the edge).

Therefore, a variable condenser positioning CPI having an optimal value for suppressing a shoulder collapse of the mask in the etching of the multilayer film may be obtained by expanding the selection range of the variable condenser positioning CPI of the variable condenser 96 to both a lower non-resonance region $LE_S$ and a higher non-resonance region $HE_S$.

EXAMPLE 3

In the plasma processing apparatus of the exemplary embodiment, the present inventors has conducted a test and found that a phenomenon (characteristic) of the plasma density distribution characteristic or the in-plane profile of the process characteristic varied depending on abrasion of the upper electrode 52 (54, 56) may be well corrected or cancelled by adjusting the variable condenser positioning of the variable condenser 96.

In the test, as Comparative Example, the variable condenser positioning CPI of the variable condenser 96 was fixed to '36', and three thicknesses CEL of the electrode plate 74 of the inner upper electrode 56 were selected as '15 mm', '10 mm', and '3 mm' to etch a photoresist. In addition, as Example, when the thicknesses CEL of the electrode plate 74 were selected as '15 mm', '10 mm', and '3 mm', the variable condenser positionings CPI of the variable condenser 96 were selected as '36', '120', and '112', respectively, and others were used under the same condition to etch a photoresist. In the test, a mixed gas of $O_2$/Ar (flow rate 20/200 sccm) was used as an etching gas, the pressure in the chamber 10 was set to 10 mTorr, the output of the upper high-frequency power supply 72 was set to 500 W, and the output of the lower high-frequency power supply 30 was set to 300 W.

Figure 11:
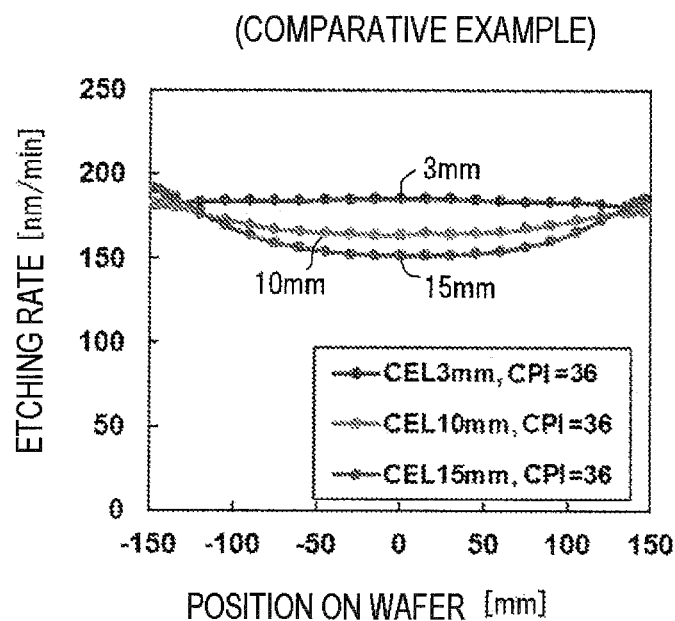
FIG. 11 is a view illustrating an etching rate characteristic (in-plane profile) on a wafer obtained in a comparative example.

FIG. 11 illustrates an etching rate characteristic (in-plane profile) on the wafer obtained in Comparative Example. As illustrated, in a case where the variable condenser positioning CPI is fixed to '36', when the thickness CEL of the electrode plate 74 is '15 mm' corresponding to a thickness of a new article, the profile has a shape in which the wafer center falls. However, when the thickness CEL of the electrode plate 74 is '10 mm' corresponding to a thickness at a time past half of the shelf life, the profile has a shape in which the fall of the wafer center is small. And, when the thickness of the electrode plate 74 is '3 mm' corresponding to a thickness at a time to finish the shelf life, the profile has a substantially flat shape as the fall of the wafer center disappears.

In the plasma processing apparatus of the exemplary embodiment, since the plasma generating high-frequency waves $RF_H$ having a higher frequency than that of the upper high-frequency power source 72 are applied to the upper electrode 52 (54, 56), although not as much as the susceptor (lower electrode plate) 12 to which the ion drawing high-frequency waves $RF_L$ having a low frequency is applied, self-bias voltage is generated even in the upper electrode 52 (54, 56), so that ions are incident from the plasma by electric fields $E_o$, $E_i$ of a sheath generated underneath. The surface of the upper electrode 52 (54, 56) is sputtered by the ion bombardment, so that the thickness CEL of the electrode is reduced (consumed) with the lapse of time.

In Comparative Example, as the thickness of the electrode plate 74 is reduced, the in-plane uniformity of the etching rate is enhanced. However, it is not desirable from the viewpoint of the reproducibility of the process. From the viewpoint of the reproducibility of the process, it is desirable that the same profile is obtained regardless of the thickness CEL of the electrode plate 74.

Figure 12:
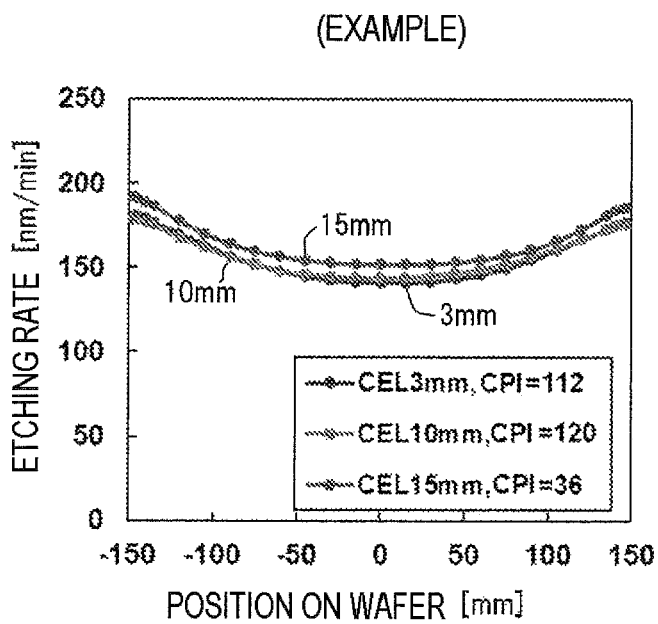
FIG. 12 is a view illustrating an etching rate characteristic (in-plane profile) on a wafer obtained in an example.

In this regard, as in Example, in a case where the thickness CEL of the electrode plate 74 is decreased from '15 mm' to "10 mm", "3 mm", it has been found that, when the variable condenser positioning CPI of the variable condenser 96 is changed from '36' in the lower non-resonance region $LE_S$ to '120', '112' in the higher non-resonance region $HE_S$, the in-plane profile of the etching rate may be constantly maintained as illustrated in FIG. 12.

Figure 13:
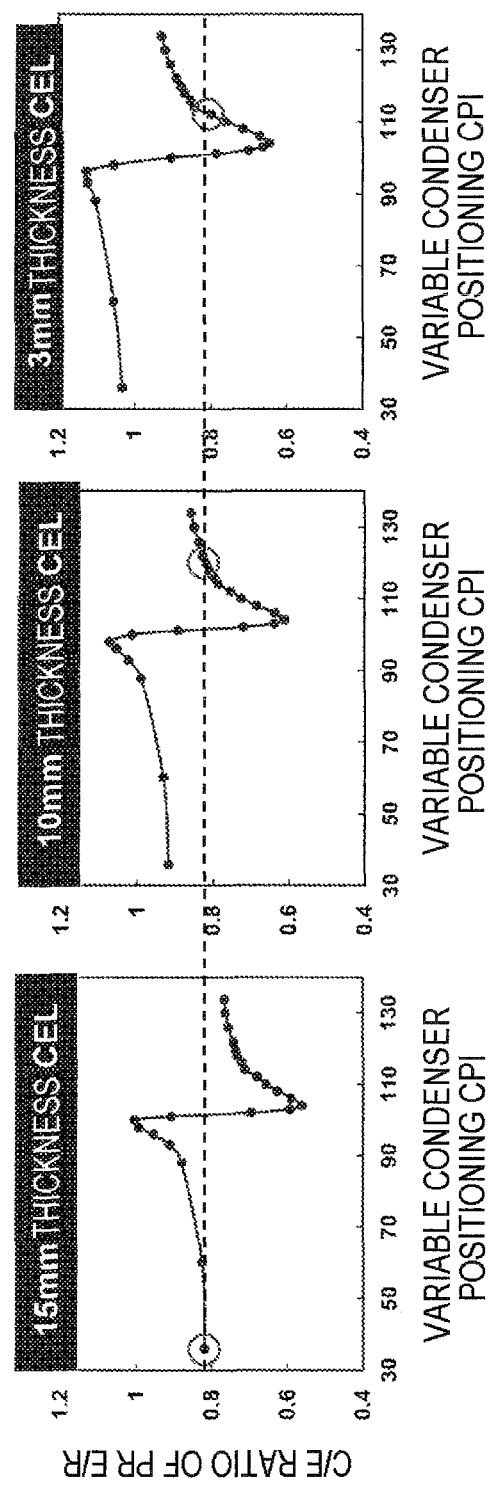
FIG. 13 is a view illustrating an action of a variable condenser positioning variable adjustment function in an exemplary embodiment.

FIG. 13 illustrates a technique of variably adjusting the variable condenser positioning to constantly maintain the in-plane profile of the etching rate (in particular, wafer center/edge) in the etching process of the photoresist (PR) during the actual process management, with respect to a temporal change of the thickness CEL of the electrode plate 74.

As illustrated, as the thickness of the electrode plate 74 decreases, a ratio of the wafer center and edge (C/E ratio) of the etching rate (E/R) generally increases. Here, in a case where the C/E ratio of E/R is 0.8 when the thickness CEL of the electrode plate 74 is '15 mm' corresponding to that of a new article, although the subsequent temporal change (abrasion degree) of the thickness CEL of the electrode plate 74 is not monitored, the value of the variable condenser positioning CPI may be adjusted such that the C/E ratio of E/R is maintained to 0.8. The variable condenser positioning variable adjustment may be performed under a control of the main control unit 98, based on software and database.

Meanwhile, in the variable condenser positioning variable adjustment, a period when the variable condenser positioning CPI corresponding to the C/E ratio of E/R of '0.8' does not exist, is present for a while in the process of transition from (the lower limit in) the lower non-resonance region $LE_S$ to (the upper limit in) the higher non-resonance region $HE_S$. In this case, a method of switching a certain value (e.g., CPI=30) in the lower non-resonance region $LE_S$ and a certain value (e.g., CPI=150) in the higher non-resonance region $HE_S$, for example, half-and-half (T/2 each), may be suitably employed.

[Other Exemplary Embodiments or Modified Embodiments]

Figure 14:
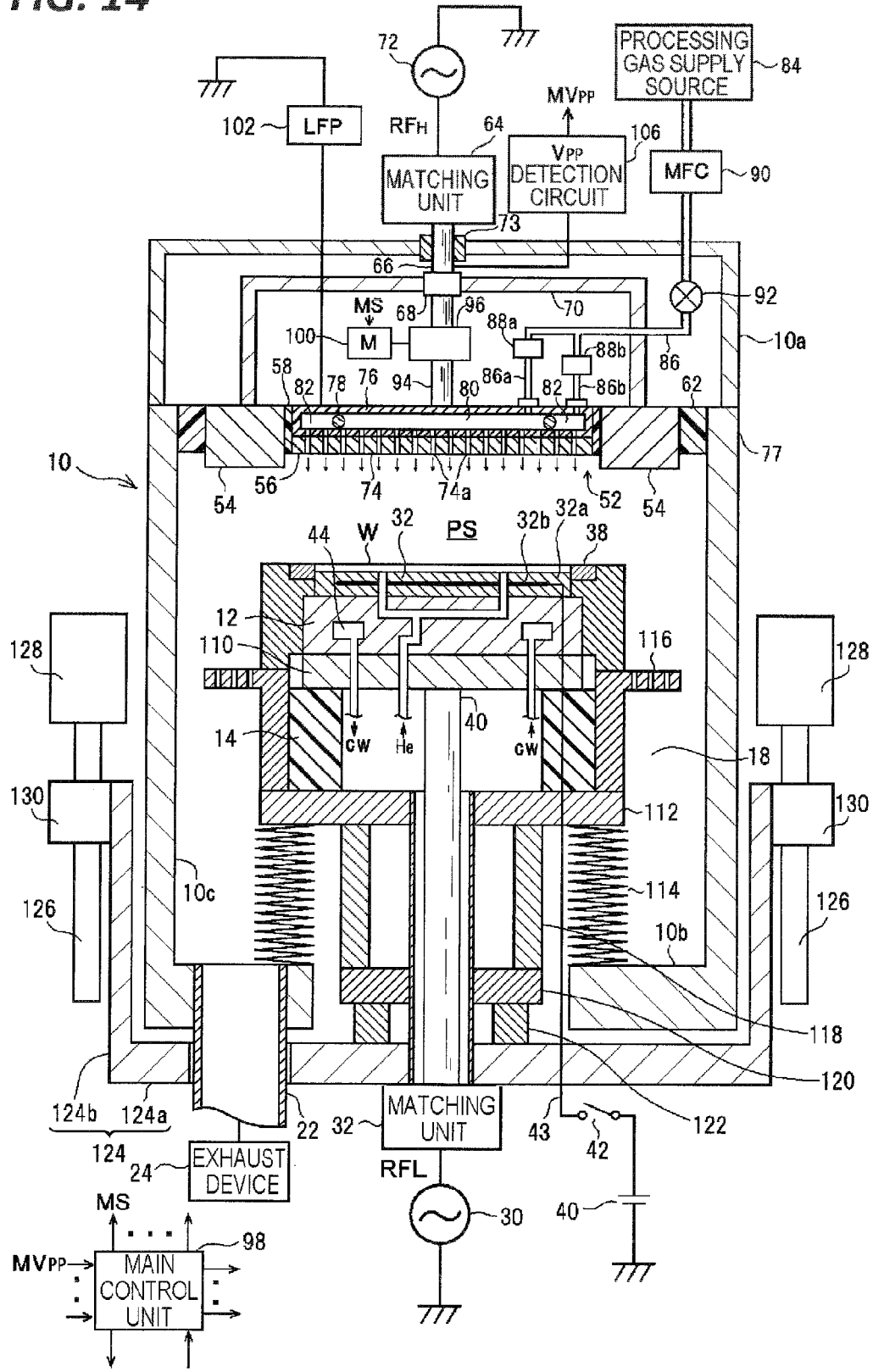
FIG. 14 is a cross-sectional view illustrating a configuration of a plasma processing apparatus according to a modified example of the exemplary embodiment.

In the capacitively coupled plasma processing apparatus (FIG. 1) in the above-mentioned exemplary embodiment, the susceptor 12 was fixed at a constant height position in the chamber 10. However, as illustrated in FIG. 14, for example, the susceptor 12 is configured to be movable or displaceable up and down in the chamber, so that the interelectrode gap between the upper electrode 52 and the susceptor (lower electrode) 12 may be variably adjusted. The variable condenser positioning adjustment function of the variable condenser 96 according to the present disclosure may further expand its role as an adjustment knob for controlling the plasma density distribution characteristic or the in-plane profile of the process characteristic, as described below, in combination with such an interelectrode gap adjustment function.

The present inventors selected three kinds of interelectrode gaps, that is, '170 mm', '130 mm', and '87 mm', selected three kinds of variable condenser positionings CPI of the variable condenser 96, that is, '36', '93', and '120' under the respective values of the interelectrode gaps, and conducted etching of $SiO_2$/photoresist (PR) under the same process conditions as in the above-mentioned first example.

Figure 15A:
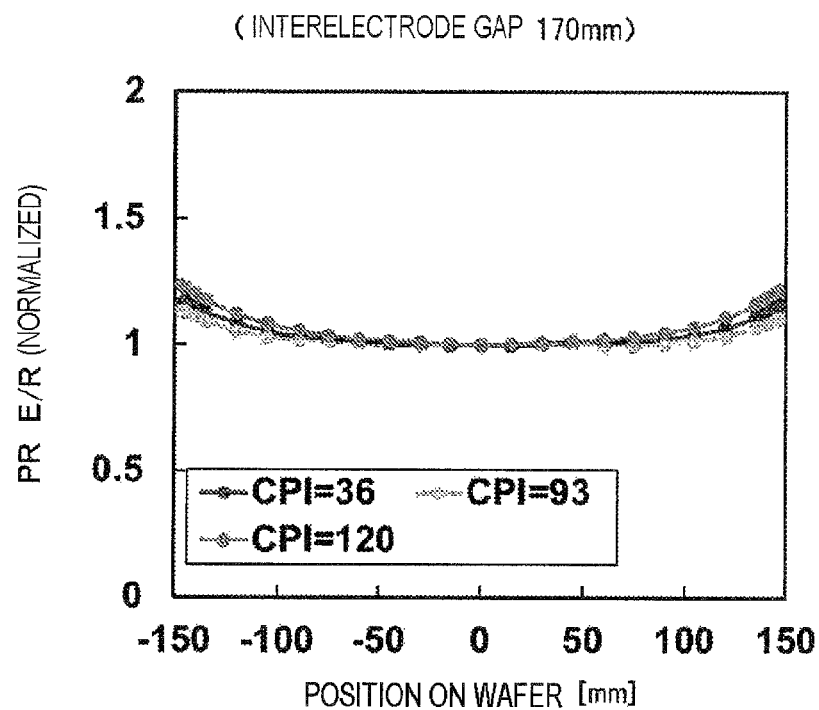
FIG. 15A is a view illustrating a photoresist (PR) etching rate characteristic when an interelectrode gap is 170 mm (fixed) and a variable condenser positioning is varied.
Figure 15B:
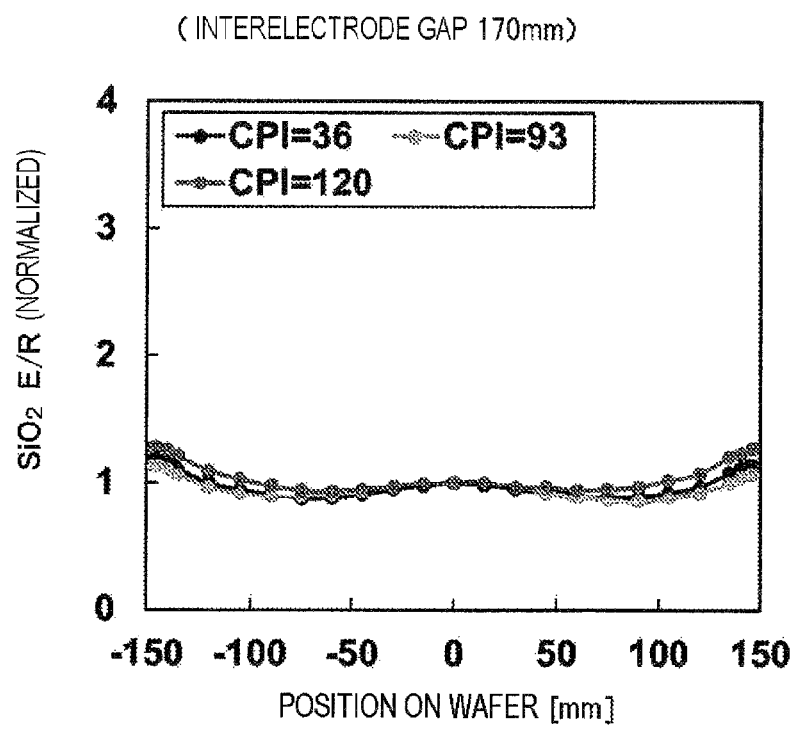
FIG. 15B is a view illustrating an $SiO_2$ etching rate characteristic when an interelectrode gap is 170 mm (fixed) and a variable condenser positioning is varied.

As illustrated in FIGS. 15A and 15B, when the interelectrode gap is set to '170 mm', the etching rate (E/R) characteristic becomes a substantially constant profile either in the $SiO_2$ etching or in the PR etching, regardless of the value of the variable condenser positioning CPI ('36', '93', or '120').

Figure 16A:
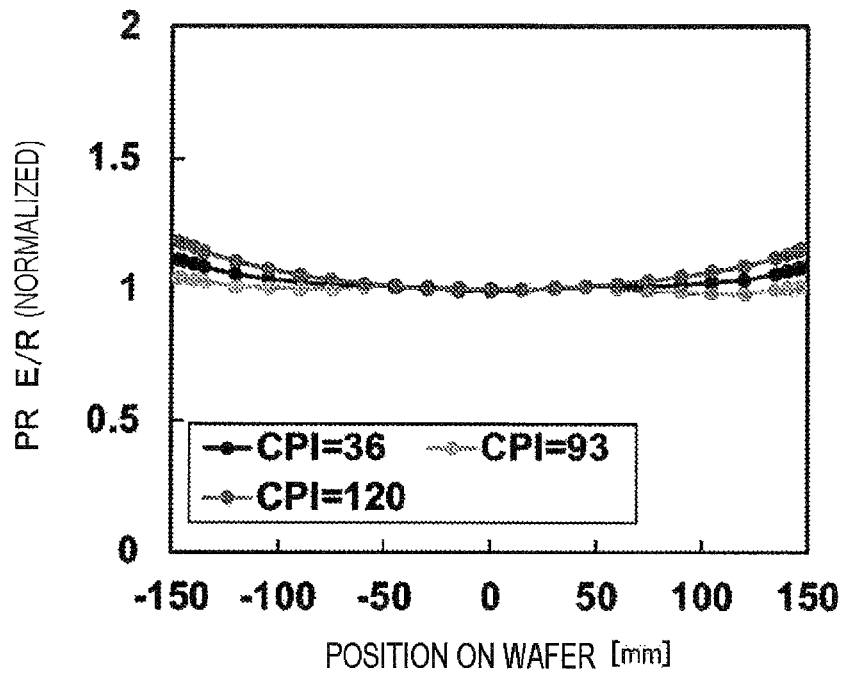
FIG. 16A is a view illustrating a PR etching rate characteristic when an interelectrode gap is 130 mm (fixed) and a variable condenser positioning is varied.
Figure 16B:
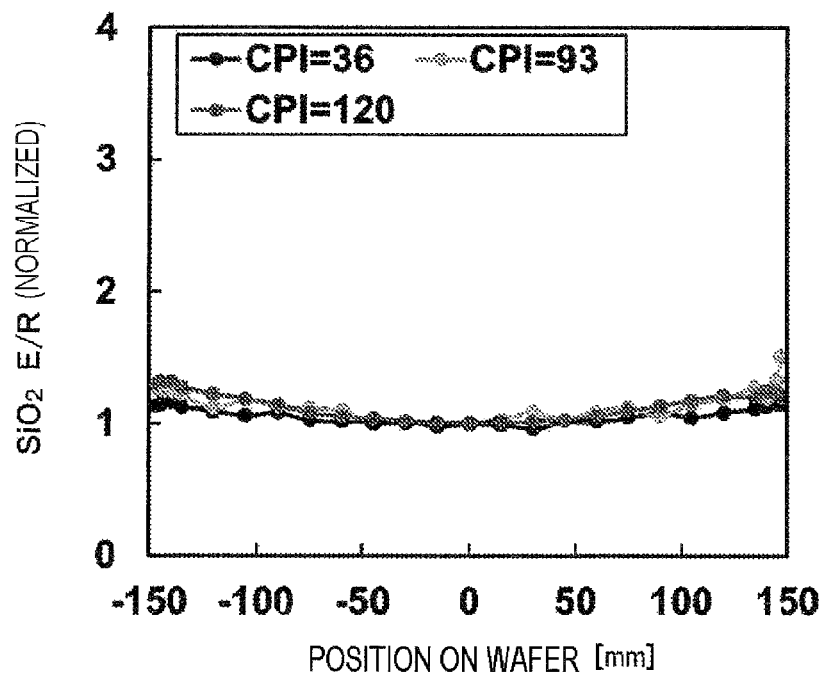
FIG. 16B is a view illustrating an $SiO_2$ etching rate characteristic when an interelectrode gap is 130 mm (fixed) and a variable condenser positioning is varied.

However, as illustrated in FIGS. 16A and 16B, when the interelectrode gap is set to '130 mm', both the profile of the E/R characteristic of $SiO_2$ and the profile of the E/R characteristic of PR may be controlled in a flat direction by swinging the variable condenser positioning CPI extensively (over the lower non-resonance region $LE_S$ and the higher non-resonance region $HE_S$) to '36', '93', '120'.

Figure 17A:
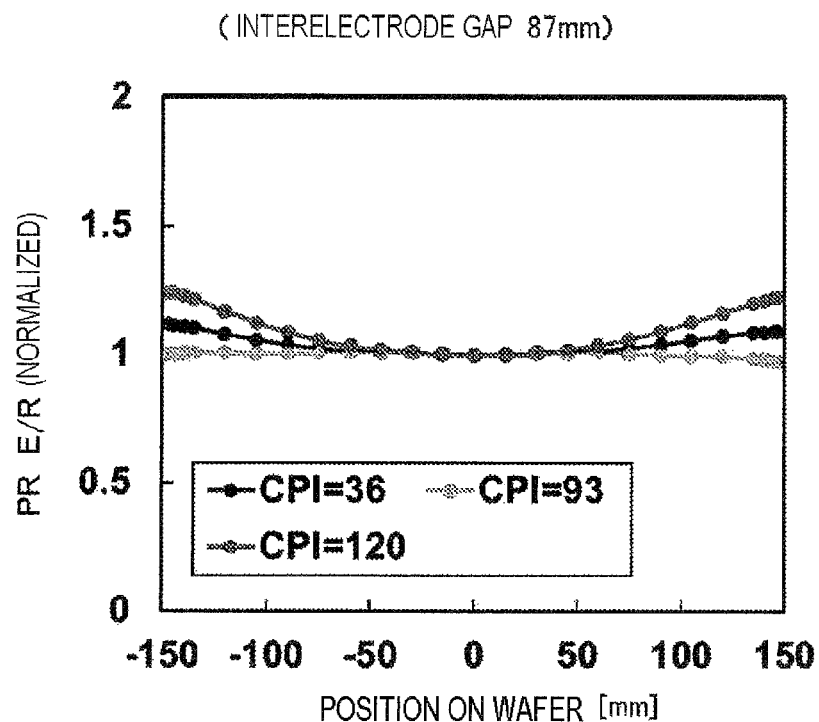
FIG. 17A is a view illustrating a PR etching rate characteristic when an interelectrode gap is 87 mm (fixed) and a variable condenser positioning is varied.
Figure 17B:
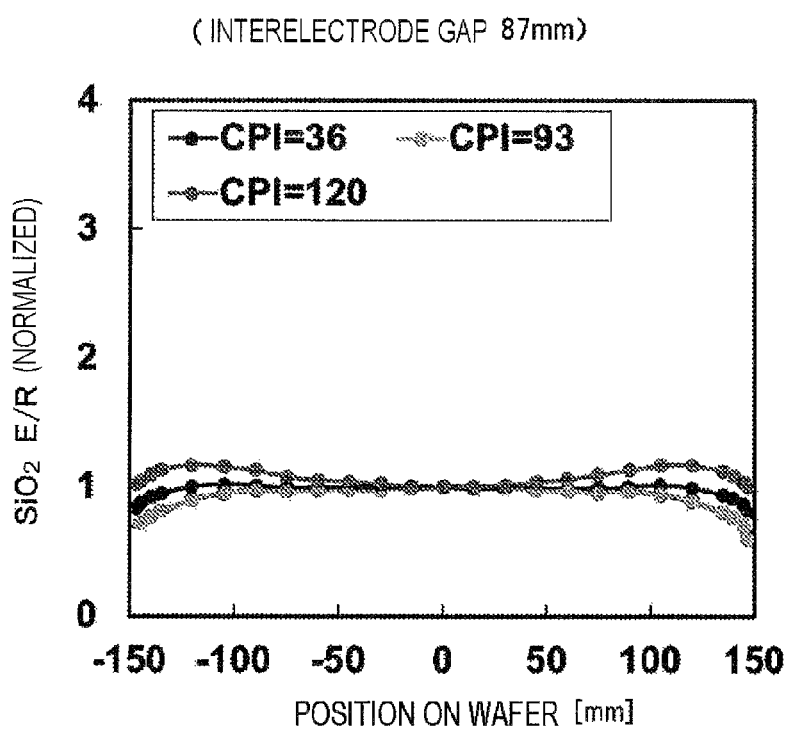
FIG. 17B is a view illustrating an $SiO_2$ etching rate characteristic when an interelectrode gap is 87 mm (fixed) and a variable condenser positioning is varied.

In addition, as illustrated in FIGS. 17A and 17B, when the interelectrode gap is set to '87 mm', both the profile of the E/R characteristic of $SiO_2$ and the profile of the E/R characteristic of PR may be remarkably variably controlled by swinging the variable condenser positioning CPI extensively (over the lower non-resonance region $LE_S$ and the higher non-resonance region $HE_S$) to '36', '93', '120'. That is, between the lower portion of the wafer center and the wafer edge, the profile of the E/R characteristic may be a valley-shaped profile in which the wafer center is lower than the wafer edge, a flat profile in which the wafer center and the wafer edge are substantially equal, or a chevron-shaped profile in which the wafer center is higher than the wafer edge.

Therefore, it has been confirmed that, as the interelectrode gap is narrower, the effect of the adjustment knob for controlling the plasma density distribution or the in-plane profile of the process characteristic is enhanced by the variable condenser positioning adjustment function of the variable condenser 96.

Meanwhile, in the apparatus configured in FIG. 14, a base 112 is configured as a movable base, which is movable up and down, to support a susceptor 12 through a dielectric cylindrical support 14 and a conductive back plate 110.

A cylindrical bellows 114 is provided between the movable base 112 and a bottom wall 10b of a chamber 10. The bellows 114 extends an exhaust path 18, which communicates with a plasma generating space (processing space) PC through a baffle plate 116, downwardly, and isolates or blocks the exhaust path 18 and the plasma generating space (processing space) PS from the atmospheric space.

An upper leg 118, an annular plate 120, and a lower leg 122 are provided in a space surrounded by the bellows 114 to be connected to each other in the vertical direction. The upper end of the upper leg 118 is coupled to the lower surface of the moving base 112, and the lower end of the upper leg 118 is coupled to the upper surface of the annular plate 120. The upper end of the lower leg 122 is coupled to the lower surface of the annular plate 120. The lower end of the lower leg 122 is coupled to a plate portion 124a of a link 124.

The link 124 includes the plate portion 124a and two pillar portions 124b. The plate portion 124a is provided below the lower portion of the chamber 10. In this exemplary configuration, a lower matching unit 32 is attached to the plate portion 124a.

The plate portion 124a, the annular plate 120, and the moving base 112 each include a through-hole extending vertically, and a lower power feeding rod 40 passes through the through-hole and extends vertically to the lower surface of the conductive back plate 110.

The pillar portions 124b extend upwardly from the peripheral portion of the plate portion 124a. Further, the pillar portions 124b extends substantially in parallel with a sidewall 10c of the chamber 10 outside the chamber 10. The pillar portions 124b are connected with a transfer mechanism constituted with, for example, a ball screw. Specifically, two screw shafts 126 extend substantially in parallel with the two pillar portions 124b outside the chamber sidewall 10c. Further, the screw shafts 126 are connected to two motors 128, respectively. Two nuts 130 are attached to the screw shafts 126, respectively. The two pillar portions 124b are coupled to the nuts 130, respectively.

According to such an elevation driving mechanism, the nuts 130 move up and down in the vertical direction by rotating the motors 128. With the up and down movement of the nuts 130, the susceptor 12, which is indirectly supported on the link 124 through the moving base 112, can move up and down in the vertical direction. In addition, with the up and down movement of the susceptor 12, the bellows 114 expands and contracts. As a result, a distance between the susceptor 12 and the upper electrode 52, that is, the interelectrode gap may be variably adjusted.

Figure 18:
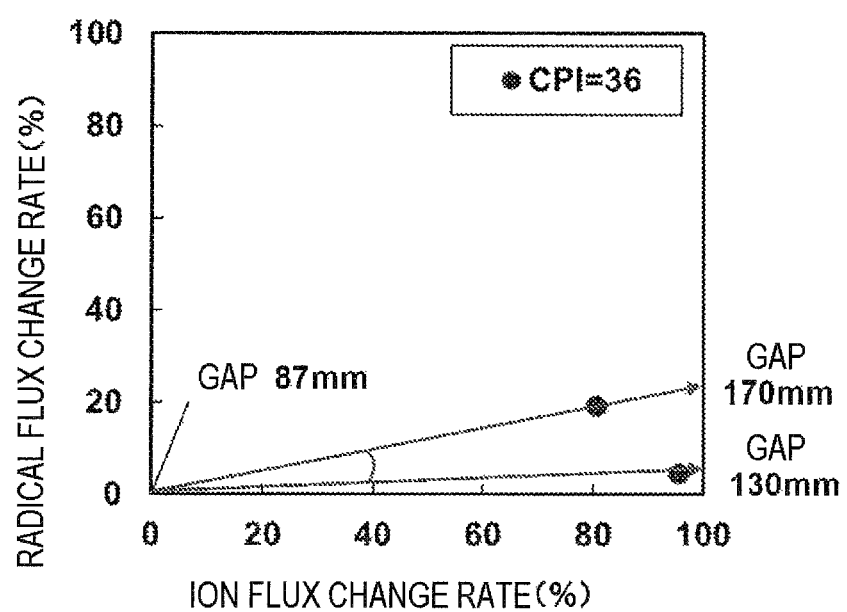
FIG. 18 is a graph illustrating a utility of combination of the variable condenser positioning adjustment function and the interelectrode gap adjustment function in the exemplary embodiment.

The present inventors analyze a combination (fused relationship) of the variable condenser positioning adjustment function of the variable condenser 96 and the interelectrode gap adjustment function from another angle as illustrated in the graph of FIG. 18. In the graph, when an ion flux $FX_i$ and a radical flux $FX_R$ in a case where the variable condenser positioning CPI is fixed to '36' and the interelectrode gap is set to '87 mm' are used as standards (starting points), a change rate $\delta FX_I$ (horizontal axis) of the ion flux $FX_i$ and a change rate $\delta FX_R$ (vertical axis) of the radical flux $FX_R$ in a case where the interelectrode gap is changed to '130 mm', '170 mm' are plotted, respectively. Meanwhile, the ion flux FXi and the radical flux FXR are calculated using the following equations (1) and (2).

$$FX_I = 100 * \text{Ion } E/R/(\text{Ion } E/R + \text{Radical } E/R) \quad (1)$$

$$FX_R = 100 * \text{Radical } E/R/(\text{Ion } E/R + \text{Radical } E/R) \quad (2)$$

Here, Ion E/R and Radical E/R represent the etching rates of photoresist (PR) and $SiO_2$ in the $SiO_2$/PR etching.

As illustrated in FIG. 18, it has been found that the ion flux $FX_i$ may be changed arbitrarily and largely without changing the radical flux $FX_R$, by changing the interelectrode gap while fixing the variable condenser positioning CPI.

Figure 19A:
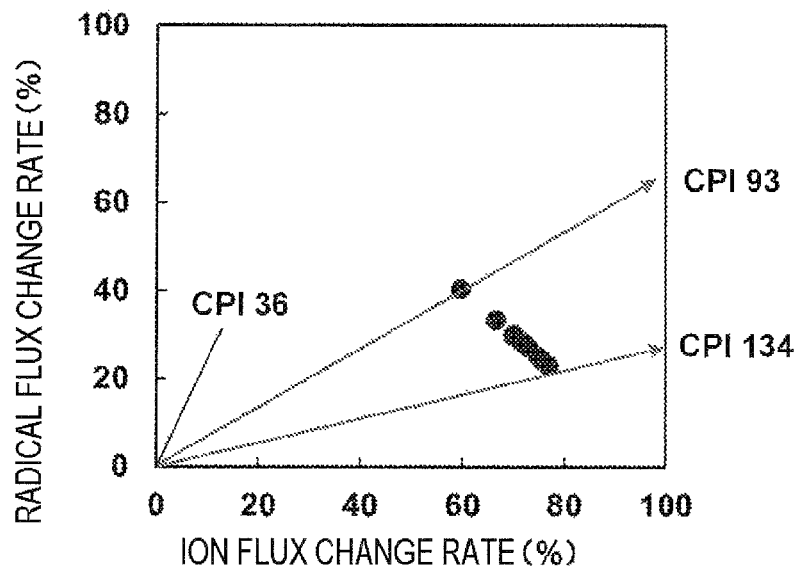
FIG. 19A is a graph illustrating a utility of combination of the variable condenser positioning adjustment function and the interelectrode gap adjustment function in the exemplary embodiment.
Figure 19B:
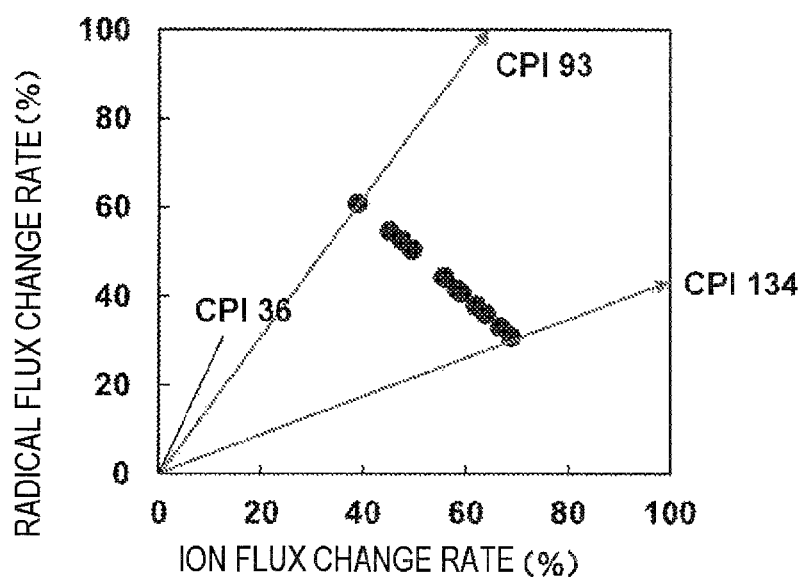
FIG. 19B is a graph illustrating a utility of combination of the variable condenser positioning adjustment function and the interelectrode gap adjustment function in the exemplary embodiment.

As illustrated in FIG. 19A (a case of a gap of 170 mm) and FIG. 19B (a case of a gap of 87 mm), it has been found that both the ion flux $FX_i$ and the radical flux $FX_R$ may be variably controlled by fixing the interelectrode gap and swinging the variable condenser positioning CPI extensively (over the lower non-resonance region $LE_S$ and the higher non-resonance region $HE_S$) to '36' (standard) and '93' to '134' (while avoiding the resonance $RE_S$). Specifically, it has been found that, as the interelectrode gap is narrower, the fluxes may be controlled extensively, as illustrated in FIG. 19B (a case of a gap of 87 mm).

Therefore, the variable condenser positioning adjustment function of the variable condenser 96 may be utilized as an auxiliary function to enhance a charged particle independent controllability of the interelectrode gap adjustment function.

The capacitively coupled plasma processing apparatus of the present disclosure is not limited to the plasma etching apparatus according to the above-mentioned exemplary embodiments, but may be applied to a capacitively coupled plasma processing apparatus that performs predetermined plasma processes such as, for example, plasma CVD, plasma ALD, plasma oxidation, plasma nitrification, and sputtering. The processing target substrate in the present disclosure is not limited to the semiconductor wafer, but may include, for example, various substrates for a flat panel display, an organic EL, and a solar cell, a photomask, a CD substrate, and a print substrate.

DESCRIPTION OF SYMBOL

10: chamber
12: susceptor (lower electrode)
30: (ion drawing) lower high-frequency power supply
52: upper electrode
54: outer upper electrode
56: inner upper electrode
58: dielectric
66: first upper power feeding rod
70: power feeding cylinder (cylindrical conductive member)
72: (plasma generating) upper high-frequency power supply
94: second upper power feeding rod (central rod-shaped conductive member)
96: variable condenser
98: main control unit
100: step motor

What is claimed is:
1. A method of performing a plasma processing on a substrate by using a plasma processing apparatus which comprises:
a processing container configured to be evacuated;
an outer upper electrode provided annularly to face a lower electrode on which a substrate is placed in the processing container;
an inner upper electrode disposed to be insulated inside the outer upper electrode in a radial direction;
a processing gas supply unit configured to supply a processing gas to a processing space between the outer upper electrode and the inner upper electrode, and the lower electrode;
a first high-frequency power supply configured to output a first high-frequency wave having a frequency suitable for generating plasma of the processing gas;
a first power feeding unit provided with a cylindrical conductive member consecutively connected to the outer upper electrode in a circumferential direction, and configured to apply the first high-frequency wave outputted from the first high-frequency power supply to the outer upper electrode through the cylindrical conductive member;
a second power feeding unit provided with a rod-shaped central conductive member connected to the center of the inner upper electrode, and configured to branch the first high-frequency wave outputted from the first high-frequency power supply from the first power feeding unit to supply the branched-off first high-frequency wave to the inner upper electrode through the central conductive member;
a variable condenser provided in the second power feeding unit to adjust a ratio of a power supplied to the plasma through the outer upper electrode and a power supplied to the plasma through the inner upper electrode; and
a variable condenser control unit configured to variably control a capacitance of the variable condenser,
wherein the first and second power feeding units, a fixed condenser formed between the outer upper electrode and the inner upper electrode, and a closed circuit including the variable condenser substantially become a resonance state with respect to the first high-frequency wave when the variable condenser has a capacitance value in a predetermined resonance region,
the method comprising:
selectively using a capacitance value in a first region lower than the resonance region of the variable condenser and a capacitance value in a second region higher than the resonance region to perform the plasma processing;
monitoring, during the plasma processing, a peak-to-peak value (Vpp) of the first high-frequency wave applied to the outer upper electrode and the inner upper electrode using a Vpp detection unit connected to the first power feeding unit; and
performing, based on a result of the monitoring, an interlocking before a variable condenser positioning (CPI) of the variable condenser enters the resonance region.
2. The method of claim 1, wherein the capacitance values of the variable condenser are variably controlled depending on a thickness of the inner upper electrode.
3. A method of performing a plasma processing on a substrate by using a plasma processing apparatus which comprises:
a processing container configured to be evacuated;
an outer upper electrode provided annularly to face a lower electrode on which a substrate is placed in the processing container;
an inner upper electrode disposed to be insulated inside the outer upper electrode in a radial direction;
a processing gas supply unit configured to supply a processing gas to a processing space between the outer upper electrode and the inner upper electrode, and the lower electrode;
a first high-frequency power supply configured to output a first high-frequency wave having a frequency suitable for generating plasma of the processing gas;
a first power feeding unit provided with a cylindrical conductive member consecutively connected to the outer upper electrode in a circumferential direction, and configured to apply the first high-frequency wave outputted from the first high-frequency power supply to the outer upper electrode through the cylindrical conductive member;
a second power feeding unit provided with a rod-shaped central conductive member connected to the center of the inner upper electrode, and configured to branch the first high-frequency wave outputted from the first high-frequency power supply from the first power feeding unit to supply the branched-off first high-frequency wave to the inner upper electrode through the central conductive member;
a variable condenser provided in the second power feeding unit to adjust a ratio of a power supplied to the plasma through the outer upper electrode and a power supplied to the plasma through the inner upper electrode;
a variable condenser control unit configured to control a capacitance of the variable condenser stepwise; and
an interelectrode gap adjusting unit configured to variably adjust an interelectrode gap between the outer upper electrode and the inner upper electrode, and the lower electrode, wherein the first and second power feeding units, a fixed condenser formed between the outer upper electrode and the inner upper electrode, and a closed circuit including the variable capacitor substantially become a resonance state with respect to the first high-frequency wave when the variable condenser has a capacitance value in a predetermined resonance region, the method comprising:

selectively using a capacitance value in a first region lower than the resonance region of the variable condenser and a capacitance value in a second region higher than the resonance region, depending on the interelectrode gap, to perform the plasma processing;

monitoring, during the plasma processing, a peak-to-peak value (Vpp) of the first high-frequency wave applied to the outer upper electrode and the inner upper electrode using a Vpp detection unit connected to the first power feeding unit; and performing, based on a result of the monitoring, an interlocking before a variable condenser positioning CPI of the variable condenser enters the resonance region.

4. The method of claim 1, wherein the capacitance value in the first region and the capacitance value in the second region are alternately switched in a single plasma processing on the substrate.

5. The method of claim 3, further comprising:

after fixing the interelectrode gap, swinging the CPI over the first region and the second region while avoiding the resonance region in order to variably control both an ion flux and a radical flux.

* * * * *